US009715145B2

(12) United States Patent
Matsukizono

(10) Patent No.: US 9,715,145 B2
(45) Date of Patent: Jul. 25, 2017

(54) LIQUID CRYSTAL DISPLAY DEVICE HAVING A LOW REFLECTING LAYER MADE OF THE SAME MATERIAL AS THE SOURCE ELECTRODE AND THE OXIDE SEMICONDUCTOR LAYER

(71) Applicant: Sharp Kabushiki Kaisha, Osaka-shi, Osaka (JP)

(72) Inventor: Hiroshi Matsukizono, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/966,020

(22) Filed: Dec. 11, 2015

(65) Prior Publication Data
US 2016/0097944 A1   Apr. 7, 2016

Related U.S. Application Data

(62) Division of application No. 13/996,602, filed as application No. PCT/JP2011/079547 on Dec. 20, 2011, now abandoned.

(30) Foreign Application Priority Data

Dec. 27, 2010   (JP) ................................ 2010-289440

(51) Int. Cl.
G02F 1/1339    (2006.01)
G02F 1/1368    (2006.01)
(Continued)

(52) U.S. Cl.
CPC .......... *G02F 1/1339* (2013.01); *G02F 1/1341* (2013.01); *G02F 1/1368* (2013.01);
(Continued)

(58) Field of Classification Search
CPC combination set(s) only.
See application file for complete search history.

(56) References Cited

U.S. PATENT DOCUMENTS 6,801,288 B1 * 10/2004 Ashizawa ......... G02F 1/134363
349/143
2009/0021664 A1 * 1/2009 Yamazaki ............... H01L 27/12
349/47

(Continued)

OTHER PUBLICATIONS

Matsukizono, "Semiconductor Device and Method for Manufacturing Same", U.S. Appl. No. 13/996,602, filed Jun. 21, 2013.

*Primary Examiner* — Lauren Nguyen
(74) *Attorney, Agent, or Firm* — Keating & Bennett, LLP

(57) ABSTRACT

A semiconductor device (1001) includes a thin-film transistor (103) including a gate electrode (3*a*), source and drain electrodes (13*as*, 13*ad*), and an oxide semiconductor layer (7), and a source bus line (13*s*). The source electrode, the source bus line and the drain electrode include a first metallic element and the oxide semiconductor layer includes a second metallic element. When viewed along a normal to its substrate, at least respective portions of the source electrode, the source bus line, and the drain electrode overlap with the oxide semiconductor layer. A low reflecting layer (4*s*, 4*d*) which includes the first and second metallic elements and which has a lower reflectance to visible radiation than the source electrode has been formed between the source electrode and the oxide semiconductor layer, between the source bus line and the oxide semiconductor layer, and between the drain line and the oxide semiconductor layer.

15 Claims, 14 Drawing Sheets

(51) Int. Cl.
G02F 1/1362 (2006.01)
G02F 1/1335 (2006.01)
G02F 1/1341 (2006.01)
H01L 27/12 (2006.01)
H01L 29/786 (2006.01)
H01L 29/66 (2006.01)
H01L 29/417 (2006.01)
H01L 29/45 (2006.01)

(52) U.S. Cl.
CPC .. *G02F 1/133553* (2013.01); *G02F 1/136209* (2013.01); *H01L 27/124* (2013.01); *H01L 27/1225* (2013.01); *H01L 29/41733* (2013.01); *H01L 29/45* (2013.01); *H01L 29/66969* (2013.01); *H01L 29/7869* (2013.01)

(56) References Cited

U.S. PATENT DOCUMENTS

| | | | |
|---|---|---|---|
| 2010/0025678 A1* | 2/2010 | Yamazaki | H01L 27/1225 257/43 |
| 2010/0207119 A1* | 8/2010 | Sakata | H01L 29/7869 257/43 |

* cited by examiner (a)

(b)

(a)

(b)

(c)

(a)

(b)

(c)

(a)

(b)

(c)

(a)

(b)

(a)

(b)

(a)

(b)

LIQUID CRYSTAL DISPLAY DEVICE HAVING A LOW REFLECTING LAYER MADE OF THE SAME MATERIAL AS THE SOURCE ELECTRODE AND THE OXIDE SEMICONDUCTOR LAYER

TECHNICAL FIELD

The present invention relates to a semiconductor device which has been formed with an oxide semiconductor, and also relates to a method for fabricating such a device.

BACKGROUND ART

An active-matrix substrate for use in a liquid crystal display device and other devices includes switching elements such as thin-film transistors (which will be simply referred to herein as "TFTs"), each of which is provided for an associated one of pixels. As such switching elements, a TFT that uses an amorphous silicon film as its active layer (and will be referred to herein as an "amorphous silicon TFT") and a TFT that uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film, and therefore, is applicable to even a device that needs to cover a large area.

Patent Documents Nos. 1 and 2 disclose TFTs with a bottom gate structure that uses an oxide semiconductor. Specifically, in the TFT disclosed in Patent Document No. 1, a metal oxide layer is arranged between an oxide semiconductor layer and source/drain electrodes in order to make them contact with each other more closely. Meanwhile, Patent Document No. 2 proposes that an opaque layer be provided closer to the viewer than an oxide semiconductor TFT is in a display device including an oxide semiconductor TFT with a bottom gate structure as its switching element (FIG. 6 of Patent Document No. 2).

CITATION LIST

Patent Literature

Patent Document No. 1: Japanese Laid-Open Patent Publication No. 2008-219008
Patent Document No. 2: Japanese Laid-Open Patent Publication No. 2010-156960

SUMMARY OF INVENTION

Technical Problem

In the conventional oxide semiconductor TFTs disclosed in Patent Documents Nos. 1 and 2, a gate electrode is arranged closer to the substrate than the oxide semiconductor layer is. This gate electrode also functions as an opaque layer and can prevent the light coming from a backlight from entering the oxide semiconductor layer. In addition, in the oxide semiconductor TFT disclosed in Patent Document No. 2, it is also possible to prevent light coming from over the substrate from entering the oxide semiconductor layer, too.

However, the present inventors discovered via experiments that it is difficult for the structures disclosed in Patent Documents Nos. 1 and 2 to prevent light (visible radiation) from entering the oxide semiconductor layer sufficiently. That is why the performance of the TFT could deteriorate due to the incoming light.

In the semiconductor devices including the conventional oxide semiconductor TFTs as disclosed in Patent Documents Nos. 1 and 2, part of the light that has come from a backlight and entered the semiconductor device without being reflected from the gate electrode becomes stray light to be repeatedly reflected inside the semiconductor device and may be incident on the channel portion of the oxide semiconductor layer. If a voltage is applied to the gate electrode with the channel portion of the oxide semiconductor layer irradiated with light, the threshold value may shift significantly due to a gate bias stress. Particularly if such an oxide semiconductor TFT is used in a display which displays an image using a backlight such as a liquid crystal display, the light coming from the backlight will be incident on the oxide semiconductor layer to shift the threshold value of the oxide semiconductor TFT and possibly cause malfunction in the display. Also, in a mobile liquid crystal display such as the LCD monitor built in a cellphone, external light such as sunlight may be incident on the oxide semiconductor layer to possibly shift the threshold value, too.

The threshold value shifts probably for the following reasons. Specifically, if an In—Ga—Zn—O (which will be referred to herein as "IGZO") based semiconductor layer is used, then IGZO is not quite transparent to visible radiation but absorbs a blue ray and other short-wave light rays to produce a level. In addition, the interface between the oxide semiconductor layer and the gate insulating film also absorbs visible radiation and produces a level. Once such levels have been produced due to exposure to light, the threshold value of the oxide semiconductor TFT varies.

The present inventors perfected our invention in order to overcome the problems described above by providing a highly reliable oxide semiconductor TFT which prevents visible radiation from being incident on the oxide semiconductor layer and which reduces such a variation in threshold value.

Solution to Problem

A semiconductor device according to the present invention includes a substrate and a thin-film transistor which is supported on the substrate. The thin-film transistor includes: an oxide semiconductor layer which includes a channel region and a source contact region and a drain contact region that are located on right- and left-hand sides of the channel region; a gate electrode which is arranged between the substrate and the oxide semiconductor layer so as to overlap with at least the channel region of the oxide semiconductor layer; a gate insulating layer which has been formed between the gate electrode and the oxide semiconductor layer; a source electrode which is electrically connected to the source contact region; and a drain electrode which is electrically connected to the drain contact region. The source electrode is electrically connected to a source bus line. The source electrode, the source bus line and the drain electrode include a first metallic element and the oxide semiconductor layer includes a second metallic element. When viewed along a normal to the substrate, at least respective portions of the source electrode, the source bus line, and the drain electrode overlap with the oxide semiconductor layer. A low reflecting layer which includes the first and second metallic elements and which has a lower reflectance to visible radiation than the source electrode has been formed between the source electrode and the oxide semiconductor layer, between the source bus line and the oxide semiconductor layer, and between the drain electrode and the oxide semiconductor layer.

In one preferred embodiment, the second metallic element is indium and the low reflecting layer includes indium metal.

In one preferred embodiment, the low reflecting layer is a reaction layer which has been formed through oxidation of the first metallic element and reduction of the second metallic element which have been caused by a reaction between the source electrode, the source bus line, and the drain electrode and the oxide semiconductor layer.

In one preferred embodiment, the respective lower surfaces of the source electrode, the source bus line and the drain electrode are entirely in contact with the low reflecting layer.

In one preferred embodiment, when viewed along a normal to the substrate, the low reflecting layer is extended from one end of the source electrode that faces the channel region toward the drain electrode by a distance Ds to partially cover the channel region and also extended from one end of the drain electrode that faces the channel region toward the source electrode by a distance Dd to partially cover the channel region, and the sum of these distances Ds and Dd is smaller than a channel length.

In one preferred embodiment, the distances Ds and Dd are both 0.1 µm to 1.0 µm.

In one preferred embodiment, the semiconductor device further includes an etch stop which covers at least the channel region of the oxide semiconductor layer.

In one preferred embodiment, the semiconductor device further includes a first interlayer insulating layer which covers the source electrode, the source bus line and the drain electrode. The low reflecting layer is obtained by forming the source electrode, the source bus line, and the drain electrode on the oxide semiconductor layer, forming the first interlayer insulating layer which covers the source electrode, the source bus line, and the drain electrode and then performing an annealing process at a temperature of 200° C. to 400° C.

In one preferred embodiment, the semiconductor device further includes a backlight which is arranged at the rear of the substrate.

In one preferred embodiment, the first metallic element is titanium, the oxide semiconductor layer includes an In—Ga—Zn—O based semiconductor, and the second metallic element is indium.

A liquid crystal display device according to the present invention includes a semiconductor device according to any of the preferred embodiments described above, and further includes: a counter substrate which is arranged to face the substrate; a liquid crystal layer which is interposed between the substrate and the counter substrate; and a seal portion which is made of a seal member including a photocurable resin and which surrounds the liquid crystal layer. The liquid crystal display device has a display area with a plurality of pixels and a frame area which is located around the periphery of the display area. The thin-film transistor is arranged in the display area. And the seal portion is arranged in the frame area. In the frame area, a light absorbing layer which absorbs light to cure the seal member has been formed between the seal portion and the display area on the substrate, and an opaque layer has been formed between the seal portion and the display area on the counter substrate. The light absorbing layer is an oxide semiconductor layer which has been formed of the same oxide semiconductor film as the oxide semiconductor layer of the thin-film transistor.

Another liquid crystal display device according to the present invention includes a semiconductor device according to any of the preferred embodiments described above, and further includes: a counter substrate which is arranged to face the substrate; a liquid crystal layer which is interposed between the substrate and the counter substrate; and a seal portion which is made of a seal member including a photocurable resin and which surrounds the liquid crystal layer. The liquid crystal display device has a display area with a plurality of pixels and a frame area which is located around the periphery of the display area. The thin-film transistor is arranged in the display area. And the seal portion is arranged in the frame area. In the frame area, a light reflecting layer which reflects light to cure the seal member has been formed to partially overlap with the seal portion, and an opaque layer has been formed on the counter substrate so as to partially overlap with the seal portion and to face the light reflecting layer. The light reflecting layer is a metal layer which has been formed of the same metal film as the source electrode. Between the metal layer and the substrate, stacked in this order on the substrate are a light absorbing layer which is formed of the same oxide semiconductor film as the oxide semiconductor layer of the thin-film transistor and a layer which includes the first and second metallic elements and which has a lower reflectance to the light than the metal layer.

In one preferred embodiment, a portion of the light absorbing layer is located between the seal portion and the display area and is not covered with the metal layer.

In one preferred embodiment, the seal portion has a gap through which a liquid crystal material is injected. The display device further includes a gap closing portion which is made of a photocurable resin and which is used to close the gap. And the light absorbing layer is also arranged between the gap closing portion and the display area.

In one preferred embodiment, the seal portion has a gap through which a liquid crystal material is injected. The display device further includes a gap closing portion which is used to close the gap. And the light reflecting layer is arranged to overlap with the gap closing portion, too.

A method for fabricating a semiconductor device according to the present invention includes the steps of: (A) forming a gate electrode on a substrate; (B) forming a gate insulating layer to cover the gate electrode; (C) forming an oxide semiconductor layer on the gate insulating layer; (D) forming, on the oxide semiconductor layer, a source electrode, a source bus line which is connected to the source electrode, and a drain electrode which is electrically isolated from the source electrode; (E) forming a first interlayer insulating layer to cover the source electrode, the source bus line and the drain electrode; and (F) performing an annealing process at a temperature of 200° C. to 400° C., thereby forming a low reflecting layer, of which the reflectance to visible radiation is lower than that of the source electrode, between the source electrode, the source bus line, and the drain electrode and the oxide semiconductor layer.

In one preferred embodiment, the method further includes the step of forming an etch stop to cover a portion of the oxide semiconductor layer to be a channel region between the steps (C) and (D).

Another method for fabricating a semiconductor device according to the present invention includes the steps of: (A) forming a gate electrode on a substrate; (B) forming a gate insulating layer to cover the gate electrode; (C) depositing an oxide semiconductor film and a metal film in this order on the gate insulating layer and patterning a stack of the two films, thereby obtaining an oxide semiconductor layer and a metal layer having the same pattern as the oxide semiconductor layer; (D) patterning the metal layer, thereby forming a source electrode, a source bus line which is connected to the source electrode, and a drain electrode which is electrically isolated from the source electrode, out of the metal layer; (E) forming a first interlayer insulating layer to cover the source electrode, the source bus line and the drain electrode; and (F) performing an annealing process at a temperature of 200° C. to 400° C., thereby forming a low reflecting layer, of which the reflectance to visible radiation is lower than that of the source electrode, between the source electrode, the source bus line, and the drain electrode and the oxide semiconductor layer.

In one preferred embodiment, the metal film includes a titanium film and the oxide semiconductor layer includes an In—Ga—Zn—O based semiconductor.

In one preferred embodiment, in the step (F), the annealing process is performed at a temperature of 350° C. to 400° C.

Advantageous Effects of Invention

According to the present invention, it is possible to prevent visible radiation from entering the oxide semiconductor layer in a semiconductor device including an oxide semiconductor TFT. As a result, a shift of the threshold value of the oxide semiconductor TFT due to the incidence of visible radiation can be reduced and its reliability can be increased.

In addition, according to the present invention, the semiconductor device can be fabricated without decreasing the productivity.

DESCRIPTION OF EMBODIMENTS

First of all, it will be described how the stray light to be repeatedly reflected in a conventional semiconductor device including an oxide semiconductor TFT affects the TFT.

Figure 14:
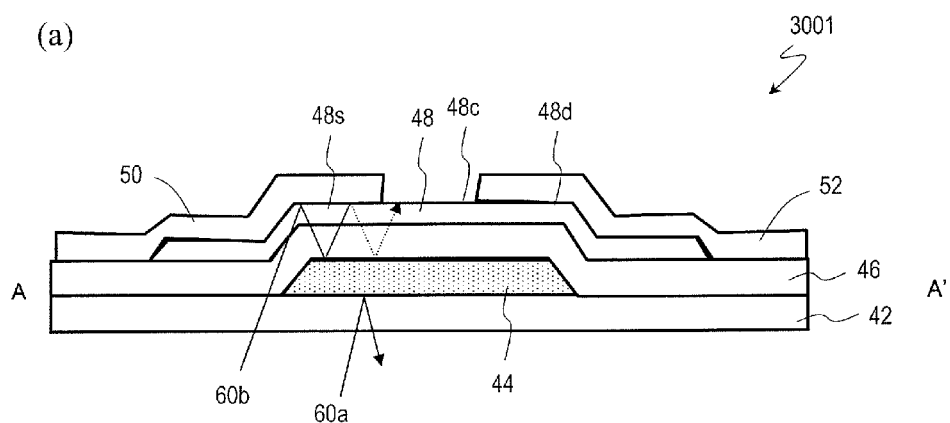
FIGS. 14 (a) and (b) are cross-sectional views illustrating structures for conventional oxide semiconductor TFTs.
Figure 14:
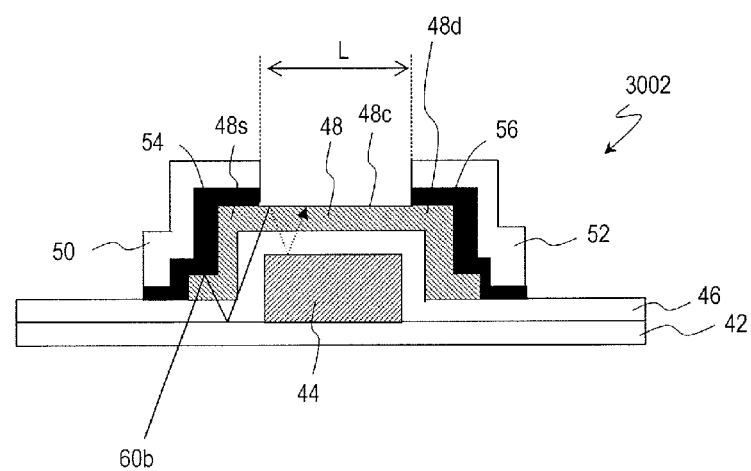

FIG. 14(a) is a cross-sectional view illustrating a semiconductor device 3001 including a conventional oxide semiconductor TFT with a bottom gate structure. The TFT structure shown in FIG. 14(a) is disclosed in Patent Document No. 2, for example.

The semiconductor device 3001 includes a substrate 42, a gate electrode 44 which has been formed on the substrate 42, a gate insulating film 46 which covers the gate electrode 44, and an oxide semiconductor layer 48, a source electrode 50 and a drain electrode 52 which have been formed on the gate insulating film 46. The oxide semiconductor layer 48 has a channel region 48c and source and drain contact regions 48s and 48d, which are arranged on right- and left-hand sides of the channel region 48c. The channel region 48c lies on top of the gate electrode 44 with the gate insulating film 46 interposed between them. The source contact region 48s contacts with the source electrode 50, while the drain contact region 48d contacts with the drain electrode 52. Although not shown, there is a backlight at the rear of the substrate 42 (i.e., on the other side thereof opposite from its side with the TFT).

In the semiconductor device 3001, of the light emitted from the backlight (which will be referred to herein as "backlight light"), a light ray 60a traveling along a normal D to the substrate 42 toward the oxide semiconductor layer 48 is reflected from the gate electrode 44 and is not incident on the oxide semiconductor layer 48. Meanwhile, another part 60b of the backlight light is not reflected from the gate electrode 44 but enters the semiconductor device 3001. That light ray 60b will be repeatedly reflected from the surface of the metal such as the source electrode (or source bus line) 50, the drain electrode (or drain line) 52 or gate electrode (or gate line) 44 and may be incident on the channel region 48c. In this description, light to be reflected repeatedly (i.e., multi-reflected light) inside the semiconductor device such as the light ray 60b will be referred to herein as "stray light". Even though the backlight light has been taken as an example, the same can be said even if external light enters the semiconductor device 3001 from over the substrate 42.

On the other hand, in the oxide semiconductor TFT 3002 disclosed in Patent Document No. 1, a metal oxide layer 54, 56 to increase the closeness of contact is interposed between the oxide semiconductor layer 48 and the source electrode 50 and between the oxide semiconductor layer 48 and the drain electrode 52 as shown in FIG. 14(b). However, the oxide semiconductor TFT 3002 is not configured to reduce the light to be incident on the channel region 48c. According to results of the experiments the present inventors carried out, the reflectance of the metal oxide layer 54, 56 to visible radiation is estimated to be approximately 20%. That is why even if the metal oxide layer 54, 56 is provided, it is still difficult to reduce the multiple reflection of the stray light sufficiently. What is more, as a part of the channel region 48c does not overlap with the gate electrode 44 in this semiconductor device 3002, the backlight light could be directly incident on the channel region 48c.

Meanwhile, although not shown, Patent Document No. 2 proposes that an opaque layer be arranged closer to the viewer than the oxide semiconductor TFT is, i.e., over the source and drain electrodes. In that case, the opaque layer can prevent light that has come from the viewer and been incident on the semiconductor device from entering the oxide semiconductor layer. However, since the opaque layer is arranged over the source and drain electrodes, the opaque layer cannot prevent the light that has entered the semiconductor device after having been transmitted through a portion of the rear substrate that is not covered with the gate electrode (i.e., the light ray 60b shown in FIG. 14(a)) from being reflected repeatedly and eventually incident on the oxide semiconductor layer.

Furthermore, even if light such as the backlight light is not incident on the vicinity of the oxide semiconductor TFT but somewhere else in the device, then that light could be repeatedly reflected from the surface of a line such as a source bus line to eventually reach the vicinity of the oxide semiconductor TFT. The configurations disclosed in Patent Documents Nos. 1 and 2 cannot prevent such light from entering the oxide semiconductor layer.

Meanwhile, the present inventors discovered that by providing a low reflecting layer with low reflectance to visible radiation between the source/drain electrodes and source bus line and the oxide semiconductor layer of the oxide semiconductor TFT, such stray light can be reduced. We discovered that if a layer formed through an oxidation reduction reaction between the metal included in the source/drain electrodes and the oxide semiconductor is used as the low reflecting layer, it is possible to prevent the stray light from affecting the performance of the TFT with sufficiently good contact maintained and without complicating the manufacturing process overly, thus perfecting our invention.

Embodiment 1

Hereinafter, a first embodiment of a semiconductor device according to the present invention will be described with reference to the accompanying drawings. The semiconductor device of this embodiment includes a thin-film transistor with an active layer made of an oxide semiconductor (which will be referred to herein as an "oxide semiconductor TFT"). The semiconductor device of this embodiment only needs to include such an oxide semiconductor TFT and may be implemented as an active-matrix substrate or any of various kinds of display devices and electronic devices.

In the following description, a TFT substrate including oxide semiconductor TFTs as its switching elements will be described as an example. The TFT substrate of this embodiment can may be used effectively in a liquid crystal display device.

FIGS. 1(a) and 1(b) are respectively a cross-sectional view and a plan view illustrating the semiconductor device 1001 of this embodiment.

The semiconductor device (TFT substrate) 1001 of this embodiment has a display area 100 with a plurality of pixel regions 101 and a terminal arrangement area (not shown) which is located outside of the display area.

Each of these pixel regions 101 is provided with a source bus line 13s which runs along a column of pixels, a gate bus line 3g which runs along a row of pixels, and an oxide semiconductor TFT 103. In this embodiment, the gate bus line 3g includes a gate electrode 3a. The oxide semiconductor TFT 103 is arranged in the vicinity of an intersection between the source bus line 13s and the gate bus line 3g. Optionally, the semiconductor device 1001 may further include a CS capacitor.

Each source bus line 13s runs through the end of the display area 100 and is electrically connected to a line which is made of the same film as the gate electrode (which will be referred to herein as a "gate connecting line") at a source-gate connecting portion 107. The gate connecting line 3c is further extended through the terminal arrangement area and connected to an external line at a terminal portion (not shown), i.e., at a source terminal. Meanwhile, even though not shown, the gate bus line 3g is also extended through the terminal arrangement area and connected to an external line at a terminal portion (i.e., at a gate terminal).

The oxide semiconductor layer 7 of each oxide semiconductor TFT 103 is connected to a source electrode 13as and a drain electrode 13ad. The source electrode 13as is connected to its associated source bus line 13s. The drain electrode 13ad is connected to a pixel electrode 19. A portion of the oxide semiconductor layer 7 where a channel is formed (i.e., a channel region 7c) is arranged to lie on top of the gate electrode 3a.

When viewed along a normal to the substrate 1, the oxide semiconductor layer 7 is overlapped by at least a part of the source electrode 13as, at least a part of the drain electrode 13ad and at least a part of the source bus line 13s. In the example illustrated in FIG. 1, the oxide semiconductor layer 7 has such a pattern that is overlapped entirely by the source electrode 13as, the source bus line 13s and the drain electrode 13ad. Optionally, the oxide semiconductor layer 7 may be split into a pattern element which is located under the source and drain electrodes 13as and 13ad and a pattern element which is located under the source bus line 13s.

Next, the cross-sectional structure of the oxide semiconductor TFT 103 will be described with reference to FIG. 1(b).

FIG. 1(b) illustrates a cross section of the oxide semiconductor TFT 103 of the semiconductor device 1001 as viewed on the plane I-I'.

The oxide semiconductor TFT 103 includes a gate electrode 3a which has been formed on a substrate 1, a gate insulating layer 5 which covers the gate electrode 3a, and an oxide semiconductor layer 7 which has been formed on the gate insulating layer 5. In this embodiment, the oxide semiconductor layer 7 may be an In—Ga—Zn—O based semiconductor (IGZO) layer, for example. The oxide semiconductor layer 7 has a channel region 7c, and a source contact region 7s and a drain contact region 7d which are arranged on the right- and left-hand sides of the channel region 7c. The channel region 7c lies on top of the gate electrode 3a with the gate insulating layer 5 interposed between them. The source electrode 13as is arranged over the source contact region 7s of the oxide semiconductor layer 7. A low reflecting layer 4s has been formed between the source contact region 7s and the source electrode 13as. The source electrode 13as is electrically connected to the source contact region 7s via the low reflecting layer 4s. The low reflecting layer 4s has also been formed between the oxide semiconductor layer 7 and the source bus line 7s. The drain electrode 13ad is arranged over the drain contact region 7d of the oxide semiconductor layer 7. A low reflecting layer 4d has been formed between the drain contact region 7d and the drain electrode 13ad. The drain electrode 13ad is electrically connected to the drain contact region 7d via the low reflecting layer 4d.

In this description, the "low reflecting layer 4s, 4d" refers herein to a layer which includes a metallic element (such as titanium) that is also included in the source bus line 13s and the source and drain electrodes 13as and 13ad and a metallic element (such as indium) that is also included in the oxide semiconductor layer 7 and which has a lower reflectance to visible radiation than the source bus line 13s and the source and drain electrodes 13as and 13ad. In this embodiment, the low reflecting layer 4s, 4d is a reaction layer which has been formed through an oxidation reduction reaction between the metallic element included in the source bus line 13s and the source and drain electrodes 13as, 13ad and the oxide semiconductor of the oxide semiconductor layer 7.

The oxide semiconductor TFT 103 is covered with an interlayer insulating layer 20 which has been formed over the source electrode 13as, the source bus line 13s and the drain electrode 13ad. The structure and material of the interlayer insulating layer 20 are not particularly limited. In this embodiment, the interlayer insulating layer 20 includes a first interlayer insulating layer (passivation film) 20A and a second interlayer insulating layer 20B which has been formed on the first interlayer insulating layer 20A.

The pixel electrode 19 is arranged on the second interlayer insulating layer 20B, and contacts with the drain electrode 13ad in a contact hole which has been cut through the first and second interlayer insulating layers 20A and 20B.

In this embodiment, the width G of the gate electrode 3a as measured in the channel length direction is longer than the distance L as measured in the channel length direction (i.e., the apparent channel length) between respective ends of the source and drain electrodes 13as and 13ad that face the channel region 7c. Also, the gate electrode 3a is arranged so as to overlap with the entire channel region 7c and respective portions of the source and drain contact regions 7s and 7d when viewed from over the back surface of the substrate 1. That is to say, so-called "offset regions" are not provided. By adopting such a configuration, it is possible to prevent the backlight light that has been transmitted through the substrate 1 from being directly incident on the channel region 7c of the oxide semiconductor layer 7.

The semiconductor device 1001 of this embodiment includes the low reflecting layer 4s, 4d which is arranged closer to the substrate than the source bus line 13s and the source and drain electrodes 13as and 13ad are, and therefore, has the following advantages.

As shown in FIG. 1(b), part of the light 29 such as backlight light or sunlight that has entered this semiconductor device 1001 is reflected multiple times between the low reflecting layer 4s, 4d and the gate electrode 3a or the gate bus line 3g. However, since the reflectance of the low reflecting layer 4s, 4d is lower than that of the metal layer such as the source electrode 13as, the intensity of the light 29 decreases as the light 29 is reflected an increasing number of times. Consequently, the quantity of the multi-reflected light to be eventually incident on the channel region 7c can be smaller than previously.

Consequently, according to this embodiment, the deterioration of the oxide semiconductor TFT 103 due to the incidence of light can be reduced and its reliability can be increased.

When viewed along a normal to the substrate 1, the low reflecting layer 4s is suitably extended by a distance Ds from one end of the source electrode 13as that faces the channel region c toward the drain electrode 13ad to partially cover the channel region 7c. Likewise, the low reflecting layer 4d is also suitably extended by a distance Dd from one end of the drain electrode 13ad that faces the channel region 7c toward the source electrode 13as to partially cover the channel region 7c. In this case, these distances Ds and Dd need to be controlled so as to prevent the low reflecting layers 4s and 4d from contacting with each other. That is to say, the sum of these distances Ds and Dd is set to be shorter than the channel length L. As a result, reflection of the light 29 from the respective side surfaces of the source and drain electrodes 13as and 13ad that face the channel region 7c can be minimized. Consequently, incidence of the light 29 onto the channel region 7c can be reduced even more effectively.

The distance Ds as measured in the channel length direction between those ends of the low reflecting layer 4s and the source electrode 13as is suitably 0.1 µm to 1.0 µm, for example. Likewise, the distance Dd as measured in the channel length direction between those ends of the low reflecting layer 4d and the drain electrode 13ad is suitably 0.1 µm to 1.0 µm, for example. If the distances Ds and Dd are equal to or greater than 0.1 µm, reflection of the light from the respective side surfaces of the source and drain electrodes 13as and 13ad that face the channel region 7c can be reduced with more certainty. However, if the distance Ds or Dd were longer than 1 µm, sufficient channel length (i.e., the distance as measured in the channel direction between the respective ends of the reflecting layers 4s and 4d that face the channel region 7c) could not be secured.

The low reflecting layer 4s is suitably arranged so as to contact with the entire lower surface of the source electrode 13as. In that case, reflection of the light 29 from the lower surface of the source electrode 13as can be minimized, and therefore, more significant effects can be achieved. For the same reason, the low reflecting layer 4d is also suitably arranged so as to contact with the entire lower surface of the drain electrode 13ad. Furthermore, the low reflecting layer 4s is suitably arranged so as to contact with at least a portion of the lower surface of the source bus line 13s which is located near the gate electrode 3a and the gate connecting line 3c. Then, the multiple reflection of the incident light can be reduced more effectively. To reduce the multiple reflection even more effectively, the low reflecting layer 4s may be arranged so as to contact with the entire lower surface of the source bus line 13s.

Next, the composition of the low reflecting layer 4s, 4d according to this embodiment will be described.

As will be described later, according to this embodiment, by forming a metal film to be the source bus line 13s and the source and drain electrodes 13as and 13ad on the oxide semiconductor layer 7 and subjecting the metal film to an annealing process, the low reflecting layer 4s, 4d is formed between the oxide semiconductor layer 7 and the metal film. As an example, by using titanium as a material (metallic material) for the source bus line 13s and the source and drain electrodes 13as and 13ad and IGZO as the oxide semiconductor, respectively, and by setting the annealing temperature to be 350° C., the low reflecting layer 4s, 4d was formed and its composition was analyzed. The results are as follows.

Figure 2:
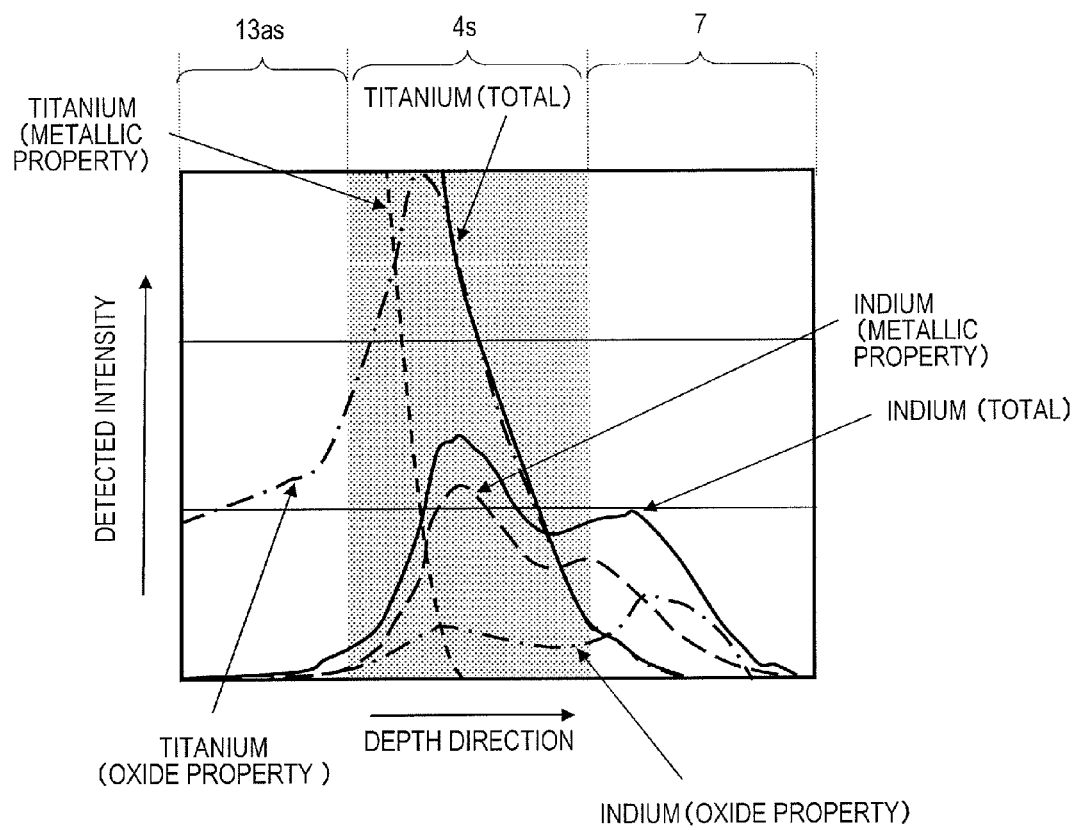
FIG. 2 Shows an exemplary composition for a low reflecting layer.
Figure 3:
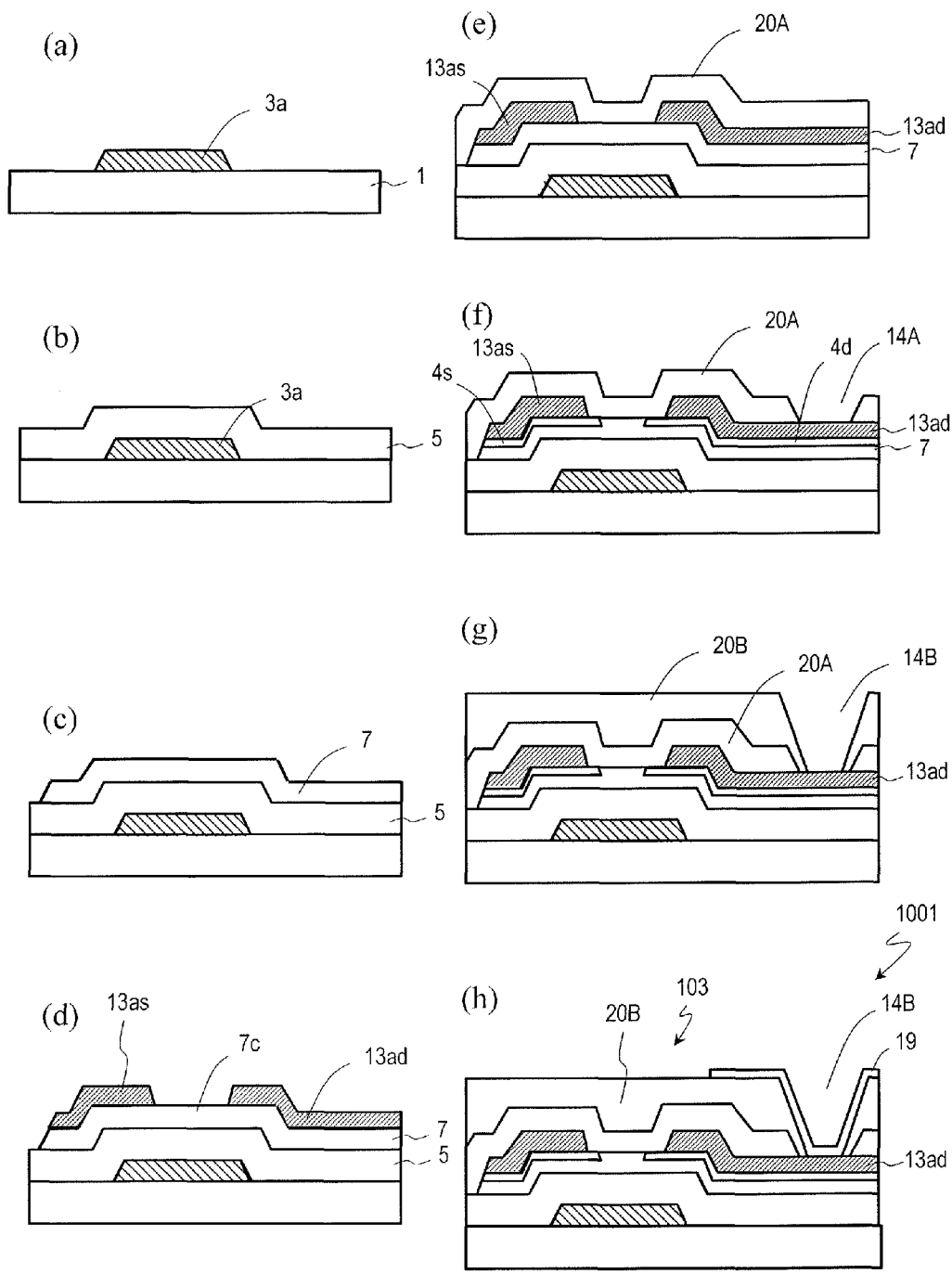
FIGS. 3 (a) through (h) are cross-sectional views illustrating an exemplary series of process steps to be carried out to fabricate the semiconductor device 1001.

The bonding state of titanium and indium in the low reflecting layer 4s, 4d was analyzed by Auger electron spectroscopy. The results are shown in FIG. 2, of which the abscissa represents the depth as measured from the upper surface of the source bus line (titanium layer) 13s and the ordinate represents the detected intensity.

Based on the results of the analysis, the present inventors confirmed that in the low reflecting layer 4s, 4d, titanium was in bonding state with an oxide property and indium was in bonding state with a metallic property. These results reveal that the low reflecting layer 4s, 4d is a reaction layer that was formed through an oxidation reduction reaction between titanium as the line material and IGZO as the oxide semiconductor (i.e., as a result of the oxidation of titanium and reduction of indium that took place simultaneously). The reaction layer that was formed as a result of this reaction had a composition including 39% of Ti, 7% of In, 6% of Ga, 1% of Zn and 47% of O.

The reflectance of the low reflecting layer thus obtained to visible radiation turned out to be 16%, for example, which is approximately a half of 30% that was the reflectance of the Ti layer to visible radiation. The reflectances of the low reflecting layer and the Ti layer to visible radiation may be measured with a spectrophotometer, for instance. In this example, the reflectance from the oxide semiconductor layer toward the lower surface of the low reflecting layer or Ti layer was measured using a spectrophotometer CM-2002 (produced by Konica Minolta Holdings, Inc.) in a mode including specular reflection (SCI mode).

According to Patent Document No. 1, an IGZO layer and source and drain electrodes are stacked one upon the other and then subjected to an annealing process at 350° C., for example, thereby forming a metal oxide layer between the IGZO layer and the source and drain electrodes. As will be described in detail later, that metal oxide layer is formed with an oxidation reaction allowed to be produced by oxygen in the annealing ambient, unlike the low reflecting layer of this embodiment. Also, as the width of the gate electrode as measured in the channel length direction is shorter than the channel length of the channel region according to Patent Document No. 1, the backlight light that has been transmitted through the substrate could be directly incident on the oxide semiconductor layer. Furthermore, according to Patent Document No. 1, a layer of oxide semiconductor islands is formed in a region where a TFT is going to be formed (which will be referred to herein as a "TFT forming region") and the metal oxide layer is formed in the source and drain contact regions of the oxide semiconductor layer in order to increase the closeness of contact between the oxide semiconductor layer and the electrode. Consequently, it should be difficult for such a configuration to reduce reflection of the light from the lower surface of the source bus line in the regions other than the TFT forming region.

Hereinafter, an exemplary method for fabricating this semiconductor device 1001 will be described with reference to the accompanying drawings.

FIGS. 3(a) through 3(h) are cross-sectional views illustrating respective process steps to form an oxide semiconductor TFT 103 on the substrate 1.

First of all, as shown in FIG. 3(a), a gate electrode (which may be a stack of Ti, Al and Ti films and may have an overall thickness of 330 nm) 3a and a gate bus line (not shown) are formed on the substrate 1. As the substrate 1, a transparent insulating substrate such as a glass substrate may be used. The gate bus line and gate electrode 3a can be obtained by forming a gate line film on the substrate 1 by sputtering process and then patterning the gate line film by photolithographic process. In this embodiment, a multilayer film with a triple layer structure consisting of titanium, aluminum and titanium films that have been stacked in this order on the substrate 1 is used as the gate line film. Alternatively, a single layer film of titanium, molybdenum, tantalum, tungsten or copper, a multilayer film including any of these metallic elements in combination, or their alloy film may also be used as the gate line film.

Next, as shown in FIG. 3(b), a gate insulating layer 5 is formed so as to cover the gate bus line and the gate electrode 3a. The gate insulating layer 5 can be obtained by depositing an insulating film by CVD process and then patterning the insulating film by photolithographic process. The insulating film may be a silicon dioxide film, a silicon nitride film, a silicon oxynitride film or a stack of any of these films. In this embodiment, a multilayer film (with a thickness of 375 nm, for example) of silicon nitride and silicon dioxide films that have been stacked in this order on the substrate 1 is used. It is recommended that the upper surface of the gate insulating layer 5 be made of silicon dioxide in this manner because even if oxygen deficiencies were produced in the oxide semiconductor layer located over the gate insulating layer 5, oxygen can be supplied from silicon dioxide in that case.

Subsequently, as shown in FIG. 3(c), an oxide semiconductor layer 7 is formed on the gate insulating layer 5. Specifically, an IGZO film is deposited by sputtering process to a thickness of 10 nm to 300 nm, for example, on the gate insulating layer 5. Thereafter, the IGZO film is patterned by photolithographic process, thereby obtaining an oxide semiconductor layer 7. The pattern of the oxide semiconductor layer 7 includes a portion which is located over the gate electrode 3a and which will be a channel region and portions which will be located under the source bus line and source and drain electrodes. The oxide semiconductor layer 7 suitably has such a pattern on which the source bus line and source and drain electrodes to be formed later can have their pattern defined entirely. Although an In—Ga—Zn—O based semiconductor layer (IGZO layer) including In (indium), Ga (gallium) and Zn (zinc) at a ratio of one to one to one is formed as the oxide semiconductor layer 7 according to this embodiment, the ratio of In, Ga and Zn may also be set to be any other appropriate value.

Alternatively, the oxide semiconductor layer 7 may also be formed out of any other oxide semiconductor film, not just the IGZO film. For example, a Zn—O based semiconductor (ZnO) film, an In—Zn—O based semiconductor (IZO) film, a Zn—Ti—O based semiconductor (ZTO) film, a Cd—Ge—O based semiconductor film or a Cd—Pb—O based semiconductor film may also be used. As the oxide semiconductor film, an amorphous oxide semiconductor film is suitably used, because such a film can be formed at a low temperature and contributes to achieving high mobility.

Next, as shown in FIG. 3(d), a source bus line (not shown) and source and drain electrodes 13as and 13ad are formed (as a single-layer titanium film with a thickness of 30 nm to 150 nm, for example) on the oxide semiconductor layer 7. The source bus line and the source and drain electrodes 13as and 13ad are arranged on the upper surface of the oxide semiconductor layer 7. However, a portion of the oxide semiconductor layer 7 to be a channel region 7c is not covered with any of these lines but is exposed.

The source bus line and the source and drain electrodes 13as and 13ad may be formed by depositing a metal film by sputtering process and then patterning that metal film by photolithographic process, for example. In this embodiment, a titanium (Ti) film is used as the metal film. Alternatively, a multilayer film in which a film of aluminum, molybdenum, tantalum, tungsten, copper or their alloy is stacked on the lower titanium film may also be used. In that case, the lower titanium film may have a thickness of 30 nm to 150 nm, for example. If the titanium film has a thickness of at least 30 nm, a low reflecting layer will be able to formed later in the manufacturing process to have a predetermined thickness and the rest of the titanium film that has not reacted with the oxide semiconductor layer will be able to be left as a source bus line.

If a multilayer film is used as the metal film, the (lowest) layer of the multilayer film that contacts with the upper surface of the oxide semiconductor layer 7 is suitably a titanium film. Then, a low reflecting layer with an even lower reflectance can be obtained. It should be noted that the reflectance can also be reduced effectively even if the titanium film is replaced with a film of aluminum, molybdenum or any other suitable metal.

Thereafter, as shown in FIG. 3(e), a first interlayer insulating layer (passivation film) 20A is formed over the source bus line and the source and drain electrodes 13as and 13ad. In this embodiment, a silicon dioxide film, a silicon nitride film, a silicon oxynitride film or a stack of any of these films is formed by CVD process as the first interlayer insulating layer 20A. The first interlayer insulating layer 20A suitably has a thickness of 100 nm to 500 nm.

Subsequently, an annealing process is carried out in a temperature range of 200 to 400° C. for two hours within an air atmosphere. In this manner, a low reflecting layer 4s is formed between the source bus line 13s and source electrode 13as and the oxide semiconductor layer 7 and a low reflecting layer 4d is formed between the drain electrode 13ad and the oxide semiconductor layer 7 as shown in FIG. 3(f). Thereafter, a hole 14A is cut through the first interlayer insulating layer 20A to partially expose the surface of the drain electrode 13ad.

Through this annealing process, the metal (titanium) included in the source bus line and 13s and the source and drain electrodes 13as and 13ad diffuses from the interface with the oxide semiconductor layer 7 toward the oxide semiconductor layer 7. As a result, the titanium that has diffused and IGZO of the oxide semiconductor layer 7 produce an oxidation reduction reaction between them, thereby oxidizing the titanium and reducing indium in IGZO into indium metal simultaneously. The reaction layer produced through this reaction becomes the low reflecting layer 4s, 4d.

As can be seen, the low reflecting layer 4s, 4d includes the indium metal to which indium has been reduced through the reaction with the line material as a result of the annealing process. The reflectance of the light that has been come from over the transparent IGZO film from the low reflecting layer 4s, 4d is determined by the refractive index n and extinction coefficient κ of the low reflecting layer 4s, 4d. To minimize the reflection from the metal film such as the source electrode 13as by arranging the low reflecting layer 4s, 4d, the extinction coefficient κ of the low reflecting layer 4s, 4d may be set to be larger than κ (≈0) of IGZO but smaller than κ of the metal (line material), which may be 2 to 3 in the case of titanium, for example. If the low reflecting layer 4s, 4d includes indium metal as described above, that κ can be set to be greater than zero but smaller than κ of that metal, and therefore, the reflection can be reduced effectively.

If the low reflecting layer 4s, 4d is formed by producing a reaction between titanium and IGZO, the annealing process temperature is more suitably 300° C. to 400° C., even more suitably 350° C. to 400° C. The reason is that the higher the annealing process temperature, the more significantly the reflectance can be reduced. The present inventors discovered via experiments that the reflectance of the reaction layer obtained by being subjected to an annealing process at 280° C. for one hour was 25% and the reflectance of the reaction layer obtained by being subjected to an annealing process at 350° C. for one hour was 16%. That is to say, we discovered that the reflectance was significantly lower than 30%, which was the reflectance before the annealing process.

According to the method disclosed in Patent Document No. 1, the annealing process is carried out with the source and drain lines and the oxide semiconductor layer exposed, and therefore, indium metal (i.e., indium with metallic bonding property), to which indium has been reduced through the oxidation reduction reaction with the metal of the line material in the reaction layer which has been produced at the interface between these lines and the oxide semiconductor layer, gets oxidized again by oxygen included in the annealing ambient. And once the indium metal has been oxidized, its metallic bond turns into a covalent bond, thus making the layer even more transparent (i.e., κ≈0). As can be seen, the reaction layer formed by the method of Patent Document No. 1 includes substantially no indium metal and its extinction coefficient κ becomes substantially equal to κ of IGZO, and therefore, cannot reduce reflection from the interface with a metal film with a large κ effectively. On the other hand, according to this embodiment, the annealing process is carried out on the indium layer covered with the passivation film, and therefore, it is possible to prevent the metallic bond of the indium from becoming a covalent bond again due to a reaction with oxygen in the annealing ambient. Consequently, the low reflecting layer 4s, 4d formed by the method of this embodiment, which includes the indium metal, has κ which is larger than κ (≈0) of IGZO but smaller than κ of the metal of the line material, and therefore, can reduce the reflection more effectively.

According to this embodiment, when the low reflecting layer 4s, 4d is formed, part of titanium diffuses in the oxide semiconductor layer 7 not only in the thickness direction but also laterally (i.e., parallel to the substrate 1) as well. As a result, one end of the low reflecting layer 4s that faces the channel region 7c gets extended by the distance Ds toward the drain electrode 13ad with respect to the corresponding end of the source electrode 13as that faces the channel region 7c. Likewise, one end of the low reflecting layer 4d that faces the channel region 7c gets extended by the distance Dd toward the source electrode 13as with respect to the corresponding end of the drain electrode 13ad that faces the channel region 7c. As described above, the distances Ds and Dd are suitably 0.1 μm to 1.0 μm. And the distances Ds and Dd can be controlled by adjusting the annealing process condition (including the annealing temperature and process time).

Subsequently, as shown in FIG. 3(g), a second interlayer insulating layer 20B, which may be a positive photosensitive resin film, for example, is deposited to a thickness of 2 μm on the first interlayer insulating layer 20A. The second interlayer insulating layer 20B is suitably made of an organic material. After that, a hole 14B is cut through the second interlayer insulating layer 20B to partially expose the surface of the drain electrode 13ad.

Next, as shown in FIG. 3(h), a pixel electrode 19 is formed. In this embodiment, a conductive film is deposited by sputtering, for example, on the second interlayer insulating layer 20B and in the hole 14B. As the conductive film, a transparent conductive film such as an ITO (indium tin oxide) film (with a thickness of 50 nm to 200 nm), an IZO film or a ZnO film (zinc oxide film) may be used. Then, the conductive film is patterned by photolithographic process, thereby obtaining the pixel electrode 19. The pixel electrode 19 is arranged so as to be electrically connected to the drain electrode 13ad in the hole 14B. In this manner, a semiconductor device 1001 including this oxide semiconductor TFT 103 is completed.

It should be noted, however, that the oxide semiconductor TFT 103 of this embodiment does not have to be formed by this method. Alternatively, as will be described below with reference to FIGS. 4(a) through 4(c), an oxide semiconductor film (such as an IGZO film) to be the oxide semiconductor layer and a metal film (such as a titanium film) to be the source bus line and source and drain electrodes may be patterned at the same time.

First of all, a gate bus line, a gate electrode 3a and gate insulating layer 5 are formed on the substrate 1 as already been described with reference to FIGS. 3(a) and 3(b).

Figure 4:
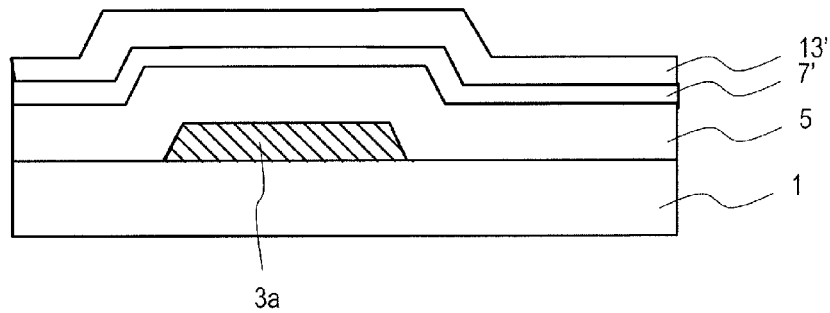
FIGS. 4 (a) through (c) are cross-sectional views illustrating another exemplary series of process steps to be carried out to fabricate the semiconductor device 1001.
Figure 4:
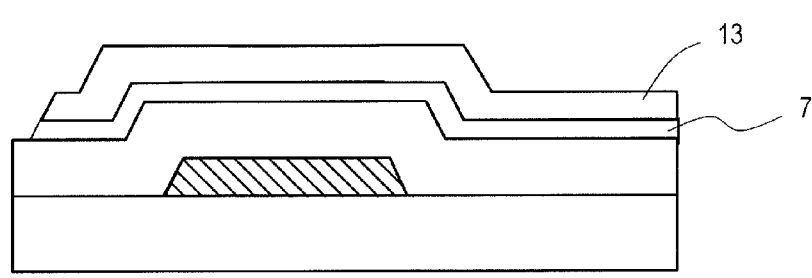
Figure 4:
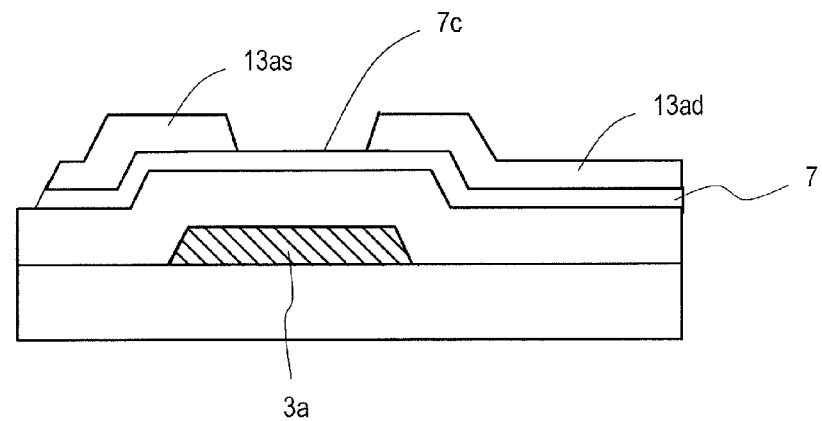

Next, as shown in FIG. 4(a), an oxide semiconductor film 7' and a metal film 13' are deposited in this order on the gate insulating layer 5. The metal film 13' may be either a titanium film or a multilayer film in which a film of molybdenum, tantalum, tungsten, copper or their alloy is stacked on the titanium film.

Thereafter, as shown in FIG. 4(b), the oxide semiconductor film 7' and the metal film 13' are patterned at the same time by photolithographic process. In this manner, a multilayer film comprised of an oxide semiconductor layer 7 and a metal layer 13 is obtained.

Subsequently, as shown in FIG. 4(c), a portion of the metal layer 13 which is located over the channel region 7c of the oxide semiconductor layer 7 is removed by photolithographic process using a half exposure technique. In this manner, the channel region 7c is exposed and the metal layer 13 is separated into a source bus line (not shown), a source electrode 13as and a drain electrode 13ad.

After that, by performing the same process steps as what has already been described with reference to FIGS. 3(e) through 3(h), the oxide semiconductor TFT 103 is obtained.

Figure 5:
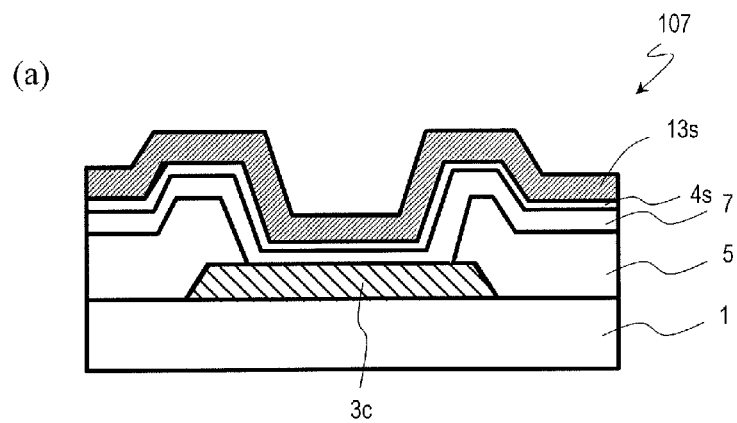
FIGS. 5 (a) through (c) are cross-sectional views illustrating three different structures for the source-gate connecting portion of the semiconductor device 1001.
Figure 5:
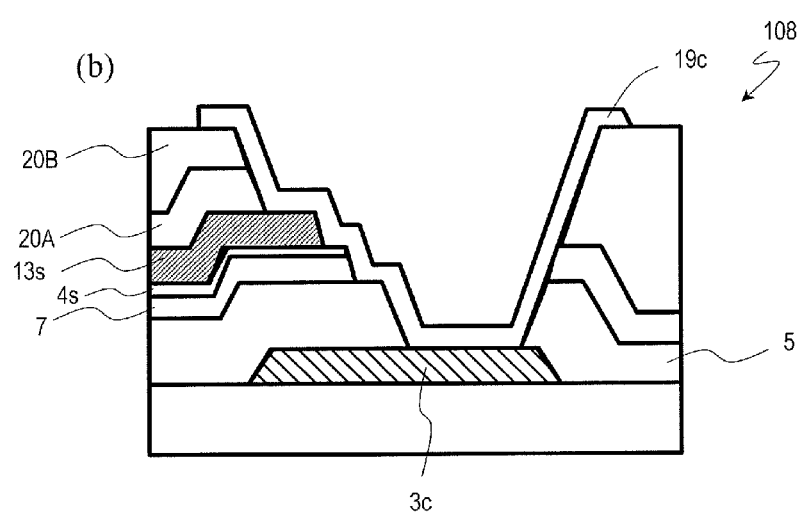
Figure 5:
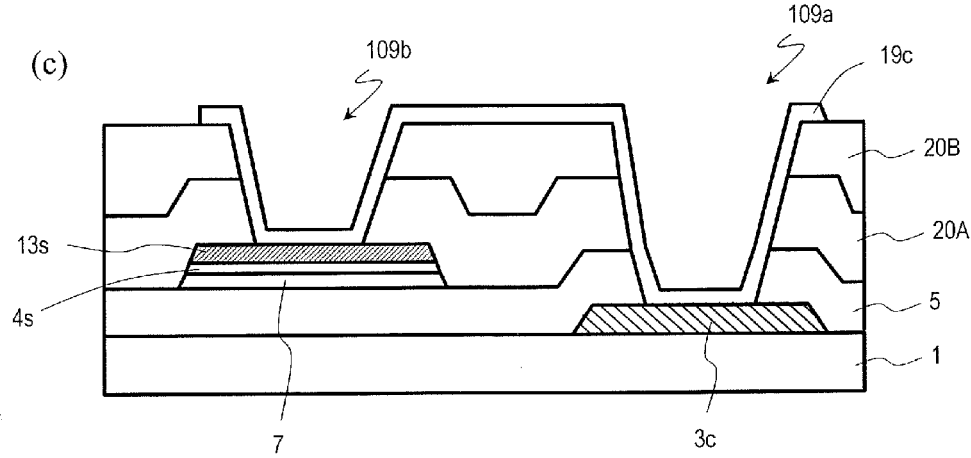

Hereinafter, the structure of a connecting portion 107 of the semiconductor device 1001 according to this embodiment will be described. FIGS. 5(a) through 5(c) are cross-sectional views illustrating the structure of the connecting portion 107 as viewed on the plane II-II' shown in FIG. 1.

In the structure shown in FIG. 5(a), a gate connecting line 3c which has been formed of the same conductive film as the gate electrode 3a is connected to a source bus line 13s via the oxide semiconductor layer 7 and the low reflecting layer 4s in a contact hole that has been cut through the gate insulating layer 5.

In this embodiment, as the oxide semiconductor layer 7 is arranged under the entire lower surface of the source bus line 13s, the oxide semiconductor layer 7 and the low reflecting layer 4s are interposed between the source bus line 13s and the gate connecting line 3c as shown in FIG. 5(a).

The oxide semiconductor layer 7 has higher resistance than a metallic material. Therefore, if a connecting portion 107 such as the one shown in FIG. 5(a) is used, the interconnection resistance will increase, which is a problem. For that reason, the device should be designed with the interconnection resistance taken into account. To reduce the interconnection resistance, the source bus line 13s and the gate connecting line 3c may be connected together with a metallic material or pixel electrode material which has lower resistance than the oxide semiconductor. If a metallic material or a pixel electrode material is used, however, the size of the connecting portion 107 might have to be increased due to some constraint such as a minimum patterning size. That is why if there is a concern about a decrease in the aperture ratio of a pixel or an increase in the size of an area which is located around the periphery of the display area of an LCD panel (i.e., the frame area), the connecting portion 107 with the structure shown in FIG. 4(a) is suitably used.

FIG. 5(b) illustrates an exemplary structure for connecting the source bus line 13s and the gate connecting line 3c together using a conductive layer 19c made of a pixel electrode material (such as ITO or IZO). In the connecting portion 108 shown in FIG. 5(b), the conductive layer 19c is formed by patterning the same transparent conductive film as the pixel electrode. Since this structure uses a pixel electrode material with low resistance, the interconnection resistance can be lower than in the structure shown in FIG. 5(a).

In this structure, the level difference made in the connecting portion 108 is greater than that of the conventional structure by the thickness of the oxide semiconductor layer. That is why it is difficult to sufficiently cover the level difference (corresponding to the depth of a contact hole) that has been made in the connecting portion 108 with the conductive layer 19c formed by a sputtering process. Particularly if the connecting portion 107 is designed so that the respective ends of the source bus line 13s and the oxide semiconductor layer 7 are aligned with each other when viewed along a normal to the substrate 1, the resultant structure could have a hung shape in which the end of the oxide semiconductor layer 107 is located inside of the end of the source bus line 13s due to some variation involved with the manufacturing process such as a photomask misalignment during a photolithographic process or an etching shift. If the connecting portion 107 has such a shape, the conductive layer 19c might be disconnected on the sidewall of the contact hole. For that reason, the connecting portion 108 is suitably designed so that when viewed along a normal to the substrate 1, the end of the source bus line 13s is located over the upper surface of the oxide semiconductor layer 7. As a result, the contact hole comes to have a tapering shape, and therefore, the process margin required can be ensured and a connection failure due to disconnection of the conductive layer 19c can be avoided.

Alternatively, as shown in FIG. 5(c), a first connecting portion 109a which connects the gate connecting line 3c and the conductive layer 19c together and a second connecting portion 109b which connects the conductive layer 19c and the source bus line 13s together may be provided. If such a structure is adopted, a larger area should be allocated to these connecting portions 109a and 109b but the source bus line 13s and the gate connecting line 3c can be connected together more securely without increasing the interconnection resistance.

Embodiment 2

Hereinafter, a second embodiment of a semiconductor device according to the present invention will be described. This embodiment includes an etch stop 9 to protect the channel region 7c over the oxide semiconductor layer 7.

Figure 1:
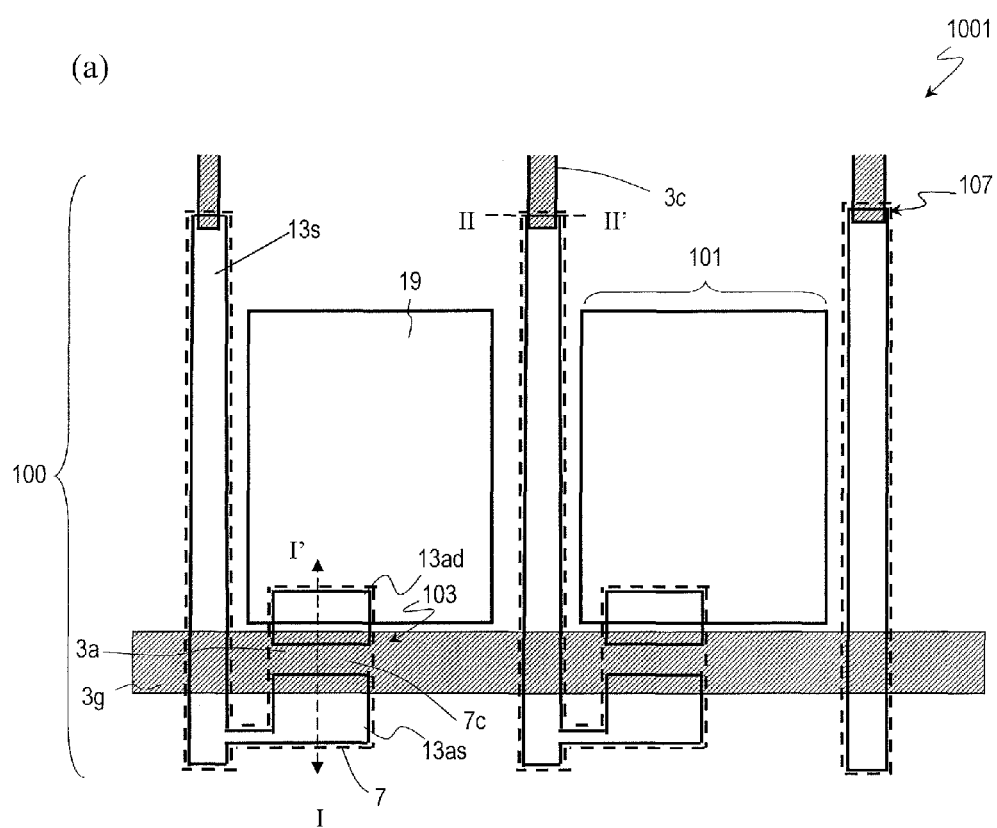
FIGS. 1 (a) and (b) are respectively a plan view and a cross-sectional view illustrating a semiconductor device 1001 as a first embodiment of the present invention.
Figure 1:
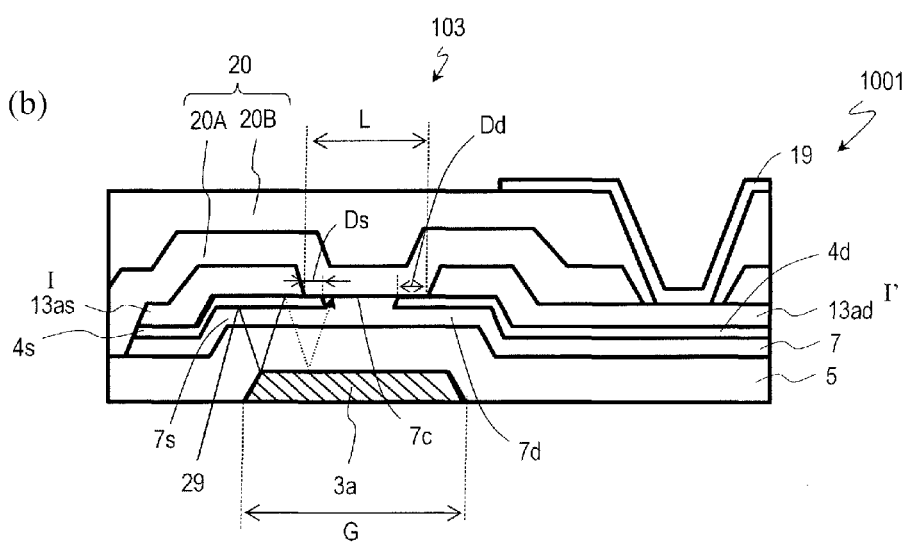
Figure 6:
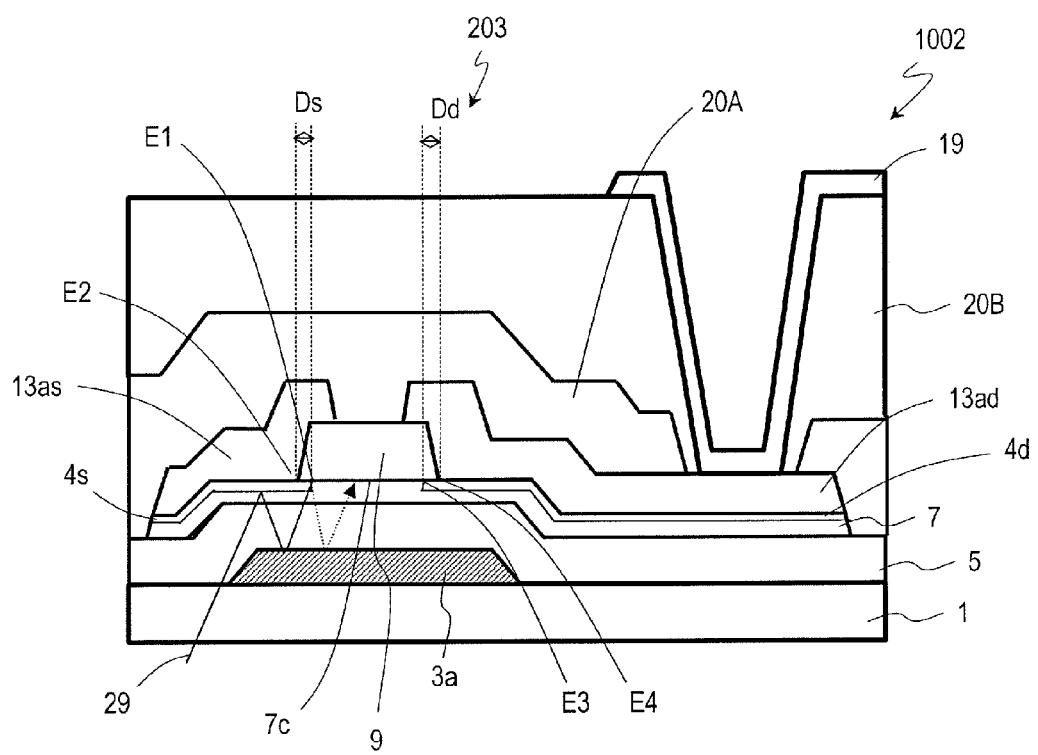
FIG. 6 A cross-sectional view illustrating a semiconductor device 1002 as a second embodiment of the present invention.
Figure 7:
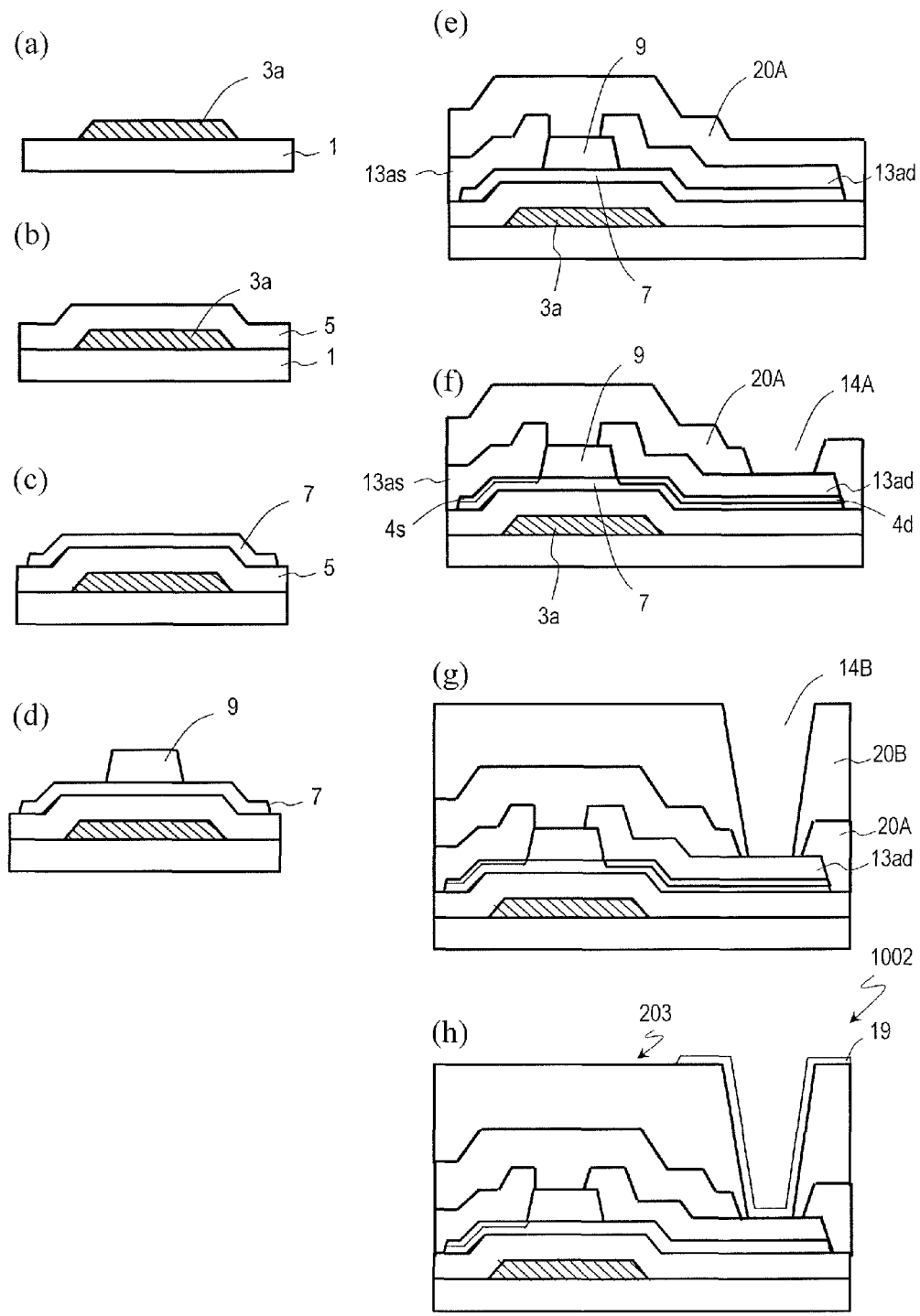
FIGS. 7 (a) through (h) are cross-sectional views illustrating an exemplary series of process steps to be carried out to fabricate the semiconductor device 1002.

FIG. 6 is a cross-sectional view illustrating an oxide semiconductor TFT 203 in the semiconductor device 1002 of this embodiment. In FIG. 6, any component also shown in FIG. 1 is identified by the same reference numeral and its description will be omitted herein. A plan view of this semiconductor device 1002 is the same as what is shown in FIG. 1, and will be omitted herein.

As shown in FIG. 6, in the oxide semiconductor TFT 203 of this embodiment, an etch stop 9 is arranged in contact with a portion of the upper surface of the oxide semiconductor layer 7 to be a channel region 7c. The etch stop 9 just needs to contact with at least that portion of the upper surface of the oxide semiconductor layer 7 to be the channel region 7c. Source and drain electrodes 13as and 13ad are arranged on the etch stop 9 and on the oxide semiconductor layer 7. At least a part of the source bus line (not shown) is also arranged on the oxide semiconductor layer 7. A low reflecting layer 4s, 4d has been formed between the oxide semiconductor layer 7 and the source bus line and between the oxide semiconductor layer 7 and the source and drain electrodes 13as and 13ad. In this embodiment, the respective lower surfaces of the source bus line and source and drain electrodes 13as and 13ad are in contact with the low reflecting layer 4s, 4d except their portions that contact with the etch stop 9. The composition of the low reflecting layer 4s, 4d may be the same as what has already been described with reference to FIG. 2.

In this embodiment, since the respective lower surfaces of the source bus line and source and drain electrodes 13as and 13ad are in contact with the low reflecting layer 4s, 4d, it is also possible to prevent the light that has entered this semiconductor device 1002 from being repeatedly reflected from the respective surfaces of the source bus line, source and drain electrodes 13as, 13ad, gate bus line and gate electrode 3a and incident on the channel region 7c of the oxide semiconductor layer 7 as in the embodiment described above. Also, since the channel region 7c is shielded from light by the gate electrode 3a when viewed from over the back surface of the substrate 1, it is also possible to prevent the light that has come through the back surface of the substrate 1 from being directly incident on the channel region 7c.

When viewed along a normal to the substrate 1, the end E1 of the low reflecting layer 4s that faces the channel region 7c is suitably located closer to the drain electrode 14ad than the end E2 of the source electrode 13as that faces the channel region 7c and that contacts with the oxide semiconductor layer 7 is. In other words, a portion of the low reflecting layer 4 is suitably located under the etch stop 9. Likewise, the end E3 of the low reflecting layer 4d that faces the channel region 7c is suitably located closer to the source electrode 13as than the end E4 of the drain electrode 13ad that faces the channel region 7c and that contacts with the oxide semiconductor layer 7 is. By adopting such an arrangement, it is possible to prevent incoming light 29 from being reflected from respective portions of the source and drain electrodes 13as, 13ad that contact with the sidewall of the etch stop 9. Consequently, incidence of the light 29 on the channel region 7c can be reduced even more effectively. The distance Ds as measured in the channel length direction between the ends E1 and E2 may be 0.1 μm to 1.0 μm, for example. Likewise, the distance Dd as measured in the channel length direction between the ends E3 and E4 may also be 0.1 μm to 1.0 μm, for example.

In addition, since at least the channel region 7c of the oxide semiconductor layer 7 is protected with the etch stop 9, the process damage to be done on the oxide semiconductor layer 7 in an etching process step to separate the source and drain electrodes 13as, 13ad from each other, in particular, can be cut down. Consequently, deterioration of the oxide semiconductor layer 7 (i.e., decrease in its resistance) can be minimized even more effectively.

Any insulating film may be used as the etch stop 9 but an oxide film such as an $SiO_2$ film is suitably used as the etch stop 9. If an oxide film is used, oxygen deficiencies, if any, in the oxide semiconductor layer 7 can be repaired with oxygen included in the oxide film. As a result, the oxygen deficiencies of the oxide semiconductor layer 7 can be reduced even more effectively.

The structure of the source-gate connecting portion in the semiconductor device 1002 of this embodiment may be the same as any of the structures that have already been described with reference to FIGS. 5(a) through 5(c).

Hereinafter, an exemplary method for fabricating the semiconductor device 1002 of this embodiment will be described.

FIGS. 7(a) through 7(h) are cross-sectional views illustrating respective process steps to fabricate an oxide semiconductor TFT 203 on the substrate 1. In FIG. 7, any component also shown in FIG. 6 and having substantially the same function as its counterpart is identified by the same reference numeral and its description will be omitted herein for the sake of simplicity.

First of all, as shown in FIGS. 7(a) through 7(c), a gate bus line, a gate electrode 3a, a gate insulating layer and an oxide semiconductor layer 7 are formed on a substrate 1 such as a glass substrate. These members may be formed in the same way, and may be made of the same materials, as their counterparts that have already been described with reference to FIGS. 3(a) through 3(c).

Next, as shown in FIG. 7(d), an etch stop 9 is formed on a portion of the oxide semiconductor layer 7 to be a channel region. In this embodiment, after an insulating film to be an etch stop has been deposited by CVD process on the oxide semiconductor layer 7 and the gate insulating layer 5, the insulating film is patterned by photolithographic process, thereby obtaining the etch stop 9. As the insulating film, a silicon dioxide film, a silicon nitride film, a silicon oxynitride film or a stack of any of these films may be used. The insulating film may have a thickness of 30 nm to 300 nm, for example. If the etch stop 9 is provided, it is possible to avoid doming etch damage on the oxide semiconductor layer 7 when an etching process step is carried out later to separate the source and drain electrodes from each other. Consequently, deterioration in the TFT performance due to such an etch damage can be minimized. Nevertheless, compared to a situation where no etch stop 9 is provided (see FIG. 3), the number of process steps to perform increases, and therefore, the productivity decreases.

Subsequently, as shown in FIG. 7(e), source and drain electrodes (which may be a single-layer titanium film with a thickness of 30 nm to 150 nm) 13as, 13ad are formed over the etch stop 9 and the oxide semiconductor layer 7, and a source bus line (not shown) is formed on the oxide semiconductor layer 7. Next, a first interlayer insulating layer (with a thickness of 100 nm to 500 nm) 20A is formed as a passivation film over the source bus line and the source and drain electrodes 13as and 13ad.

The source bus line and the source and drain electrodes 13as and 13ad are arranged in contact with the upper surface of the oxide semiconductor layer 7. The source bus line and the source and drain electrodes 13as, 13ad may be formed in the same way, and may be made of the same materials, as their counterparts that have already been described with reference to FIG. 3(d). Also, the first interlayer insulating layer 20A may be formed in the same way, and may be made of the same material, as its counterpart that has already been described with reference to FIG. 3(e).

Subsequently, an annealing process is carried out in a temperature range of 200 to 400° C. for two hours within an air atmosphere. In this manner, a low reflecting layer 4s is formed between the source electrode 13as and the oxide semiconductor layer 7 and a low reflecting layer 4d is formed between the drain electrode 13ad and the oxide semiconductor layer 7 as shown in FIG. 7(f). Thereafter, a hole 14A is cut through the first interlayer insulating layer 20A to partially expose the surface of the drain electrode 13ad.

Subsequently, as shown in FIGS. 7(g) and 7(h), a second interlayer insulating layer 20B (which may be a positive photosensitive resin film, for example) and a pixel electrode 19 are formed. These members may be formed in the same way, and may be made of the same materials, as their counterparts that have already been described with reference to FIGS. 3(g) and 3(h). In this manner, a semiconductor device 1002 including an oxide semiconductor TFT 203 is completed.

Figure 8:
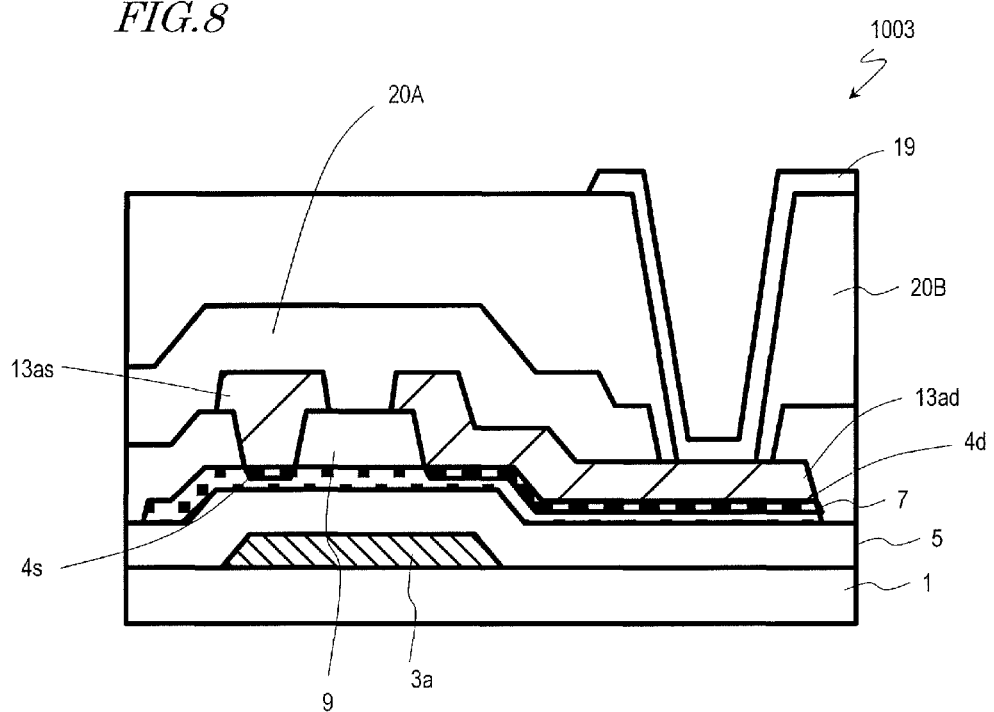
FIG. 8 A cross-sectional view illustrating another semiconductor device 1003 according to the second embodiment of the present invention.

The semiconductor device of this embodiment does not have to have the configuration shown in FIG. 6. For example, the source electrode 13as may be connected to the oxide semiconductor layer 7 via the low reflecting layer 4s in a hole that has been cut through the etch stop 9 as in the semiconductor device 1003 shown in FIG. 8. If such a configuration is adopted, the damage to be done on the oxide semiconductor layer 7 in the etching process step to separate the source and drain electrodes from each other can be further reduced. In that case, however, the low reflecting layer 4s is arranged under only a portion of the lower surface of the source electrode 13as, and the stray light can be reduced less effectively than in the semiconductor device 1002 shown in FIG. 6. Optionally, although not shown, the drain electrode 13ad may also be connected to the oxide semiconductor layer 7 via the low reflecting layer 4d in a hole that has been cut through the etch stop 9.

Figure 9:
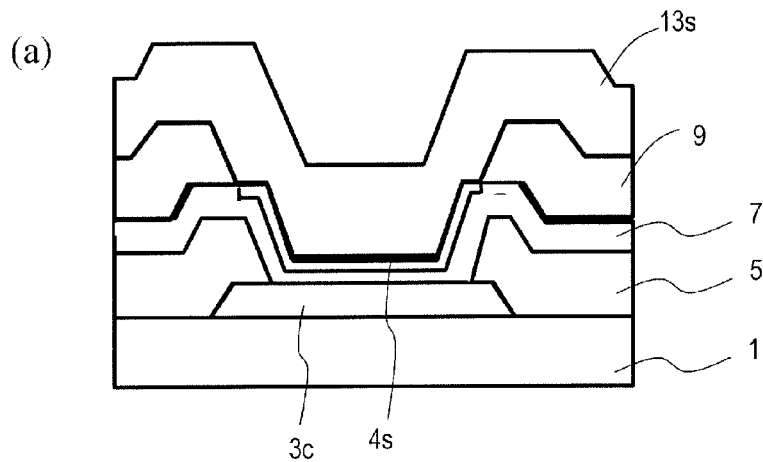
FIGS. 9 (a) through (c) are cross-sectional views illustrating three different structures for the source-gate connecting portion of the semiconductor device 1003.
Figure 9:
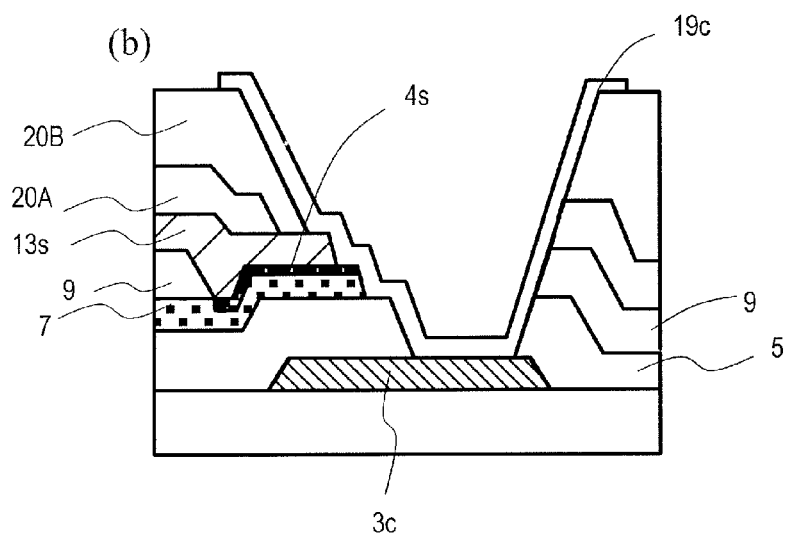
Figure 9:
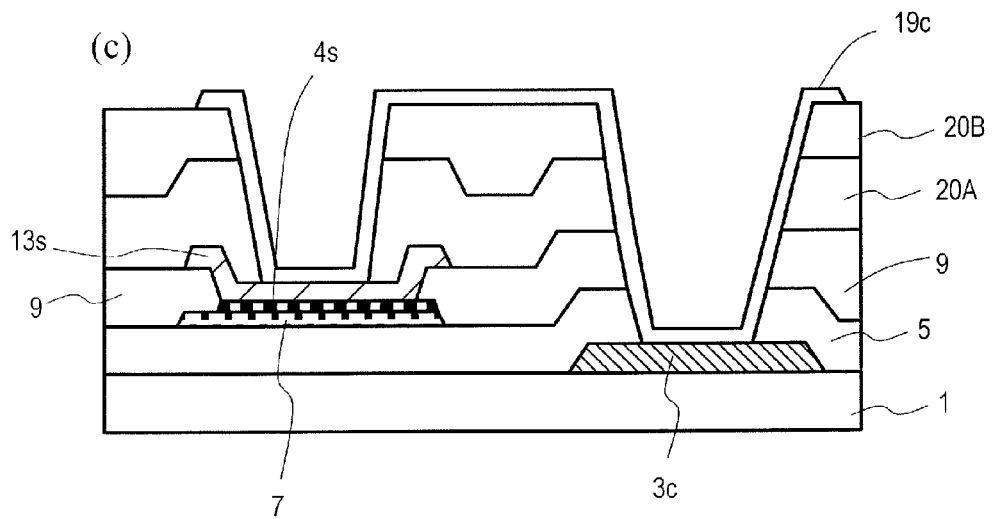

FIGS. 9(a) through 9(c) are cross-sectional views illustrating exemplary structures for the source-gate connecting portion of the semiconductor device 1003. In the source-gate connecting portion, the source bus line (source line) 13s and the gate connecting line 3c may be electrically connected together with the low reflecting layer 4s and the oxide semiconductor layer 7 interposed between them as shown in FIG. 9(a). Alternatively, the source line 13s and the gate connecting line 3c may also be connected together through a conductive layer 19c as shown in FIG. 9(b). In that case, in the connecting portion, a portion of the etch stop 9 between the oxide semiconductor layer 7 and the source line 13s is suitably removed. As a result, the low reflecting layer 4s is formed in contact with the lower surface of the source line 13s, and therefore, multiple reflection of the incoming light between the source line 13s and the gate connecting line 3c can be reduced. Still alternatively, as shown in FIG. 9(c), a first connecting portion which connects the conductive layer 19c and the gate connecting line 3c together and a second connecting portion which connects the conductive layer 19c and the source line 13s together may be provided. In that case, a portion of the etch stop 9 between the oxide semiconductor layer 7 and the source line 13 is suitably removed in the second connecting portion. As a result, the low reflecting layer 4s is formed in contact with the lower surface of the source line 13s, and therefore, multiple reflection of the incoming light between the source line 13s and the gate connecting line 3c of the first connecting portion can be reduced.

Embodiment 3

Hereinafter, a third embodiment of a semiconductor device according to the present invention will be described. The semiconductor device of this embodiment is implemented as a liquid crystal display device which includes an oxide semiconductor TFT and which has been fabricated with a liquid crystal material injected by dripping method.

A liquid crystal display device includes a pair of substrates and a liquid crystal layer interposed between the two substrates. According to the dripping method, first of all, a seal member is applied onto one of the two substrates so as to surround an area to define the liquid crystal layer, and a liquid crystal material is dripped inside that area. After that, a liquid crystal panel is formed by bonding the two substrates together, and a portion of the liquid crystal panel that is surrounded with the seal member is entirely filled with the liquid crystal material. Subsequently, the seal member is irradiated with ultraviolet ray (UV ray) and cured.

In a conventional liquid crystal display device including an oxide semiconductor TFT, the UV ray used to cure the seal member may be reflected repeatedly between the two substrates and may be incident on the channel region of the oxide semiconductor TFT. If the UV ray is incident on the channel region, the performance of the TFT will deteriorate as will be described later. For that reason, in the conventional liquid crystal display device, no TFTs may be arranged near the seal member, and therefore, the non-display area (i.e., the frame area) should be expanded, which is a problem.

Figure 13:
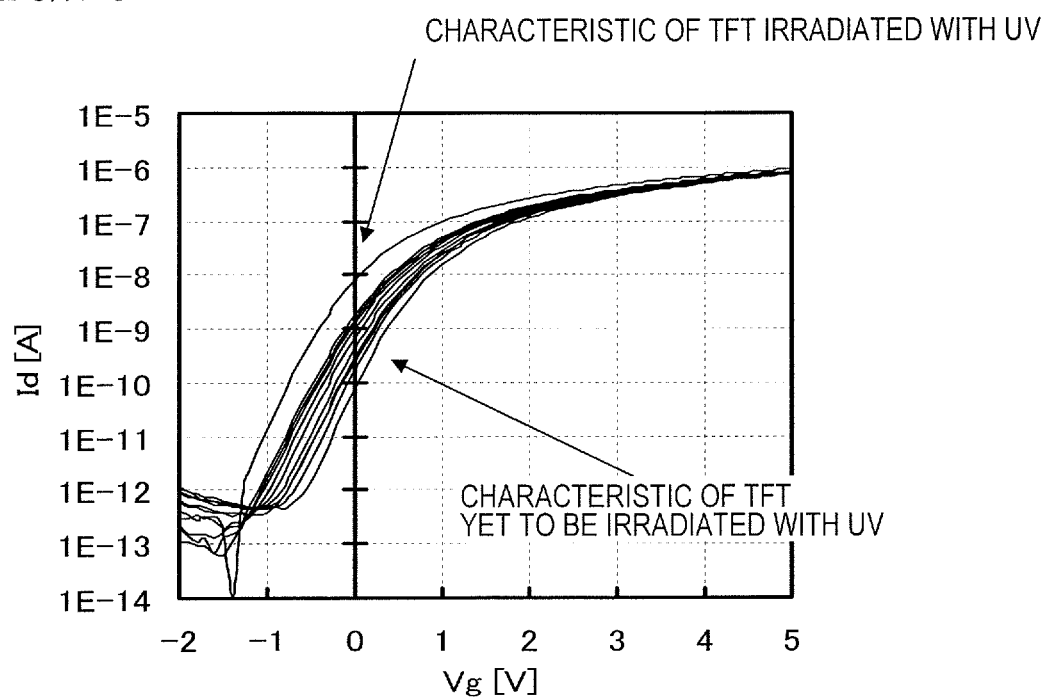
FIG. 13 A graph showing how the characteristic of a conventional oxide semiconductor TFT changes before and after it is irradiated with a UV ray.

FIG. 13 is a graph showing how the voltage-current characteristic of an oxide semiconductor TFT changes before and after its channel region is irradiated with a UV ray. The oxide semiconductor TFT which was used to evaluate its characteristic may be an IGZO-TFT with the conventional TFT structure shown in FIG. 14(a). As can be seen from FIG. 13, if the channel region of the oxide semiconductor TFT is irradiated with a UV ray, its turn-on voltage and threshold voltage both tend to shift toward the negative quadrant (i.e., these voltages tend to decrease). That is why if such an oxide semiconductor TFT is used as a pixel driving TFT, for example, the potential that has been written on its pixel electrode can be retained less perfectly, thus possibly causing luminance unevenness, flicker and other display defects. For that reason, some countermeasure should be taken so as to prevent the light to cure the seal member for use in the dripping method or a photosensitive resin for use in a vacuum process (to be described later) from becoming stray light and irradiating the channel region of the oxide semiconductor TFT.

Thus, to reduce the multiple reflection of the light that has been incident on the vicinity of the seal member, an oxide semiconductor layer is provided according to this embodiment as a light absorbing layer (UV absorbing layer) between the area where the seal member is applied and the display area. The oxide semiconductor layer absorbs a UV ray, and therefore, can prevent the UV ray from being reflected a number of times and eventually incident on the display area.

Figure 10:
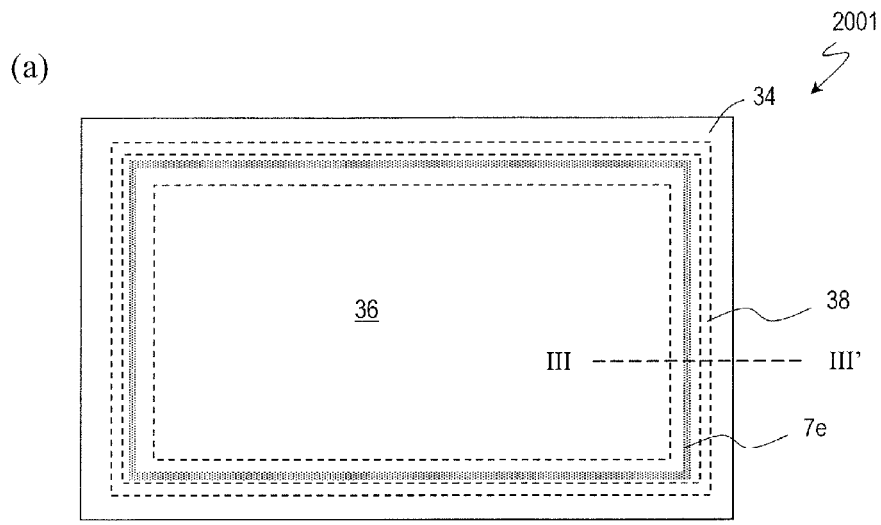
FIGS. 10 (a) and (b) are respectively a plan view and an enlarged cross-sectional view illustrating a liquid crystal display device 2001 as a third embodiment of the present invention.
Figure 10:
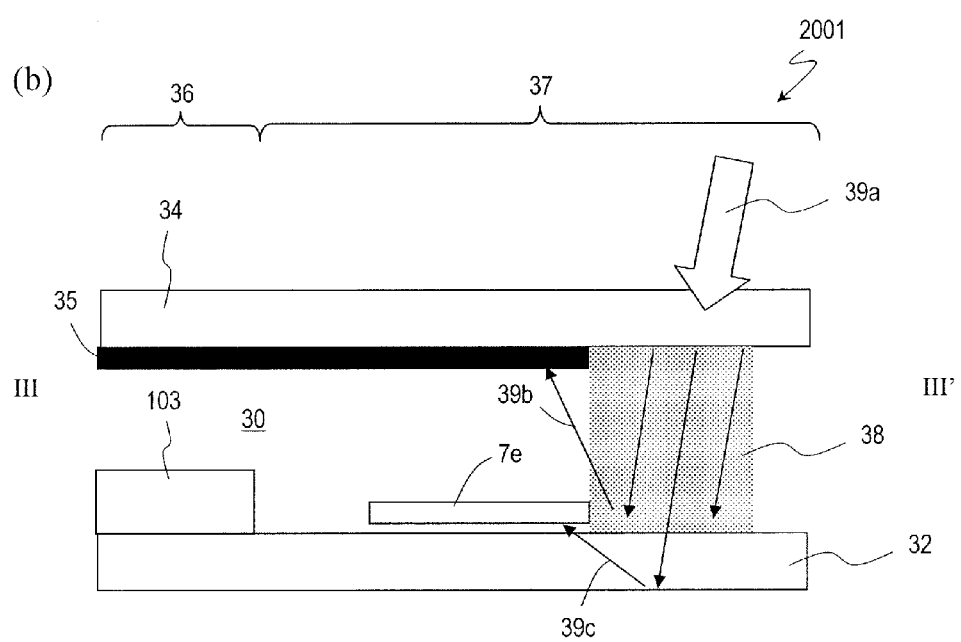

FIGS. 10(a) and 10(b) are respectively a plan view and an enlarged cross-sectional view illustrating a part of the peripheral portion of the liquid crystal display device of this embodiment. This liquid crystal display device 2001 includes a liquid crystal layer 30, a rear substrate 32 which is arranged behind the liquid crystal layer 30, and a front substrate 34 which is arranged closer to the viewer than the liquid crystal layer 30 is. Also, when viewed along a normal to the substrate 32, this liquid crystal display device 2001 has a display area 36 including a plurality of pixels and a frame area 37 which surrounds the display area 36. A seal portion 38 to inject the liquid crystal material hermetically has been formed in the frame area 37.

In the display area 36, an oxide semiconductor TFT 103 is provided on the rear substrate 32. The oxide semiconductor TFT 103 may have the structure that has already been described with reference to FIG. 1 or the structure that has been described with reference to FIG. 6. On the front substrate 34, on the other hand, color filters (not shown) and a black matrix (opaque layer) 35 have been formed.

In the frame area 37, an oxide semiconductor layer 7e has been formed on the rear substrate 32. The oxide semiconductor layer 7e may be made of the same semiconductor film (with a thickness of 10 nm to 300 nm) as the active layer of the oxide semiconductor TFT 103. When viewed along a normal to the rear substrate 32, the oxide semiconductor layer 7e is suitably arranged between the seal portion 38 and the display area 36 so as to surround the display area 36. Thus, the quantity of light to enter the display area 36 through the peripheral portion of the LCD panel can be reduced with more certainty. It should be noted that the oxide semiconductor layer 7e just needs to be located closer to the display area 36 with respect to the seal portion 38 and does not have to surround the display area 36 entirely. On the front substrate 34, on the other hand, a black matrix 35 has been formed in the frame area 37. When viewed along a normal to the substrate 32, the seal portion 38 is located outside of the black matrix 35 and the oxide semiconductor layer 7e.

In this liquid crystal display device 2001, the seal member that has been applied onto one of the two substrates is irradiated with an UV ray that has come from outside of the device, gets cured, and turns into the seal portion 38. Thus, the entire peripheral portion of the LCD panel may be irradiated with the UV ray 39a that has come from over the front substrate 34, for example. Parts 39b and 39c of the incoming UV ray do enter this LCD panel but are absorbed into either the black matrix 35 or the oxide semiconductor layer 7e and not incident on the display area 36. Consequently, it is possible to prevent the incoming UV ray from being reflected a number of times inside this liquid crystal display device 2001 and eventually incident on the channel region of the oxide semiconductor TFT 103. In addition, since the stray light to be produced by such multiple reflection of the UV ray can be reduced, the interval between the oxide semiconductor TFT 103 and the seal portion 38 can be shortened. As a result, the frame area 37 can have a smaller area (i.e., can be narrowed). Furthermore, according to this embodiment, when an oxide semiconductor layer to be the active layer of the oxide semiconductor TFT 103 is formed, the oxide semiconductor layer 7e can also be formed out of the same semiconductor film. Therefore, deterioration of the TFT performance due to incidence of light can be minimized without increasing the number of manufacturing process steps to perform.

Figure 11:
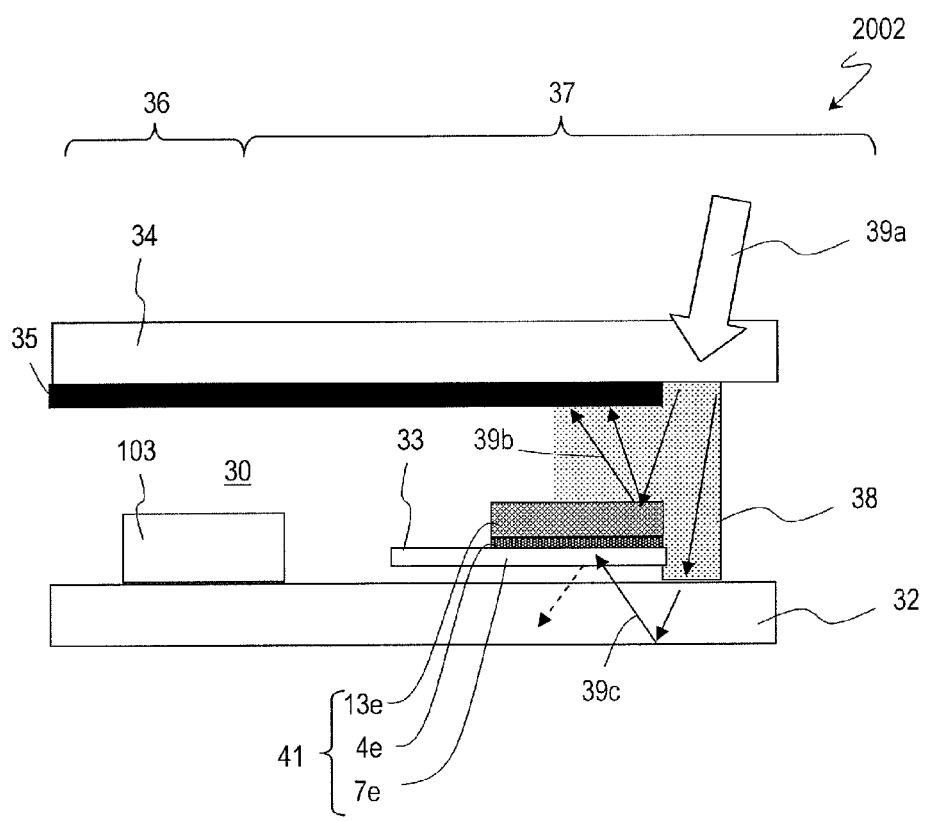
FIG. 11 A cross-sectional view illustrating another liquid crystal display device 2002 according to the third embodiment.

FIG. 11 is an enlarged cross-sectional view illustrating a part of the peripheral portion of another liquid crystal display device according to this embodiment. In FIG. 11, any component also shown in FIG. 10 and having substantially the same function as its counterpart is identified by the same reference numeral and its description will be omitted herein for the sake of simplicity.

In this liquid crystal display device 2002, the seal portion 38 is arranged so as to partially overlap with the black matrix 35. Also, a multilayer film 41 in which an oxide semiconductor layer 7e, a low reflecting layer 4e and a metal layer 13e have been stacked in this order is arranged on the rear substrate 34. When viewed along a normal to the substrate 32, the multilayer film 41 comprised of the oxide semiconductor layer 7e, the low reflecting layer 4e and the metal layer 13e is suitably arranged between the seal portion 38 and the display area 36 so as to surround the display area 36. It should be noted that these layers just need to be located closer to the display area 36 with respect to the seal portion 38 and do not have to surround the display area 36 entirely.

In this embodiment, the metal layer 13e is arranged so as to face a portion of the black matrix 35 that overlaps with the seal portion 38, and functions as a light reflecting layer (UV reflecting layer). Meanwhile, a portion 33 of the oxide semiconductor layer 7e is suitably not covered with the metal layer 13e. That portion 33 of the oxide semiconductor layer 7e that is not covered with the metal layer 13e functions as a light absorbing layer (UV absorbing layer).

In this embodiment, the oxide semiconductor layer 7e is also made of the same semiconductor film as the active layer of the oxide semiconductor TFT 103. Also, the metal layer 13e is made of the same metal film as the source and drain electrodes. And the low reflecting layer 4e is a reaction layer which has been formed between the metal layer 13e and the oxide semiconductor layer 7e through an annealing process, and is formed simultaneously with the low reflecting layer 4s, 4d of the oxide semiconductor TFT 103 (see FIG. 1).

In this liquid crystal display device 2002, a portion of the seal member which has been applied onto one of the two substrates is directly irradiated and cured with a UV ray 39a that has come from outside of the device and transmitted through the front substrate 34. Another portion of the seal member gets cured with a light ray 39b that has come from outside of this device, transmitted through the front substrate 34 and then reflected from the surface of the metal layer 13e.

In this embodiment, parts 39b and 39c of the incoming UV ray do enter this LCD panel but are absorbed into either the black matrix 35 or the oxide semiconductor layer 7e and not incident on the display area 36, either. Consequently, it is possible to prevent the incoming UV ray from being reflected a number of times inside this liquid crystal display device 2002 and eventually incident on the channel region of the oxide semiconductor TFT 103.

According to this embodiment, a part of the seal portion 38 can be arranged so as to overlap with the peripheral portion of the black matrix 35. In addition, since the stray light to be produced by such multiple reflection of the UV ray can be reduced, the interval between the oxide semiconductor TFT 103 and the seal portion 38 can be shortened. As a result, the frame area 37 can have a smaller area (i.e., can be narrowed).

Furthermore, the multilayer film 41 comprised of the oxide semiconductor layer 7e, the low reflecting layer 4e and the metal layer 13e may also be used as a static electricity protection line or a signal line. Then, the frame area can be further narrowed.

According to this embodiment, the oxide semiconductor layer 7e, the low reflecting layer 4e and the metal layer 13e can be formed in the same process step as the process step of forming the oxide semiconductor TFT 103. As a result, deterioration of the TFT performance due to incidence of light can be minimized without increasing the number of manufacturing process steps to perform.

If the upper surface of the oxide semiconductor layer 7e is partially exposed under the metal layer 13e as shown in FIG. 11, that portion 33 of the oxide semiconductor layer 7e that is not covered with the metal layer 13e can function as a UV absorbing layer, and the stray light can be reduced even more effectively. That portion 33 functioning as a UV absorbing layer is suitably located closer to the display area 36 than the seal portion 38 and the metal layer 13e are. Optionally, a single oxide semiconductor layer may be provided as a UV absorbing layer closer to the display area 36 than the multilayer film 41 is, separately from the multilayer film 41.

Embodiment 4

Hereinafter, a fourth embodiment of a semiconductor device according to the present invention will be described. A semiconductor device according to this embodiment is implemented as a liquid crystal display device which includes an oxide semiconductor TFT and which has been fabricated by injecting a liquid crystal material by vacuum process.

According to a vacuum process, first of all, a photocurable seal member is applied onto one of the two substrates so as to surround an area to define a liquid crystal layer. In this process step, a gap to inject a liquid crystal material through later is left. Next, the two substrates are bonded together and the seal member is irradiated and cured with a UV ray, thereby obtaining a pre-injection panel. After that, the pre-injection panel is loaded into a vacuum vessel and evacuated, thereby creating a vacuum inside the pre-injection panel. Next, the gap portion (i.e., an injection port) of the seal member is dipped into a liquid crystal material, and the internal space in the vacuum vessel is exposed to the air. As a result, the liquid crystal material is injected through the injection port into the panel. To prevent the liquid crystal material injected from leaking through the injection port, the injection port is closed with a photocurable resin (i.e., a gap closing member) to be cured with a UV ray or visible radiation.

In a conventional liquid crystal display device including an oxide semiconductor TFT, light such as a UV ray used to cure the seal member or the gap closing member to close the liquid crystal material injection port may be reflected repeatedly inside the panel and may be incident on the channel region of the oxide semiconductor TFT. If the light is incident on the channel region, the performance of the TFT will deteriorate. For that reason, in the conventional liquid crystal display device, no TFTs may be arranged near the seal member or the gap closing member, and therefore, the frame area should be expanded, which is a problem.

To overcome such a problem, according to this embodiment, a multilayer film comprised of an oxide semiconductor layer, a low reflecting layer and a metal layer and a black matrix are arranged in the area on which the seal member and the gap closing member are applied. In this manner, the multiple reflection of the incoming light can be minimized and the frame area can be narrowed.

Figure 12:
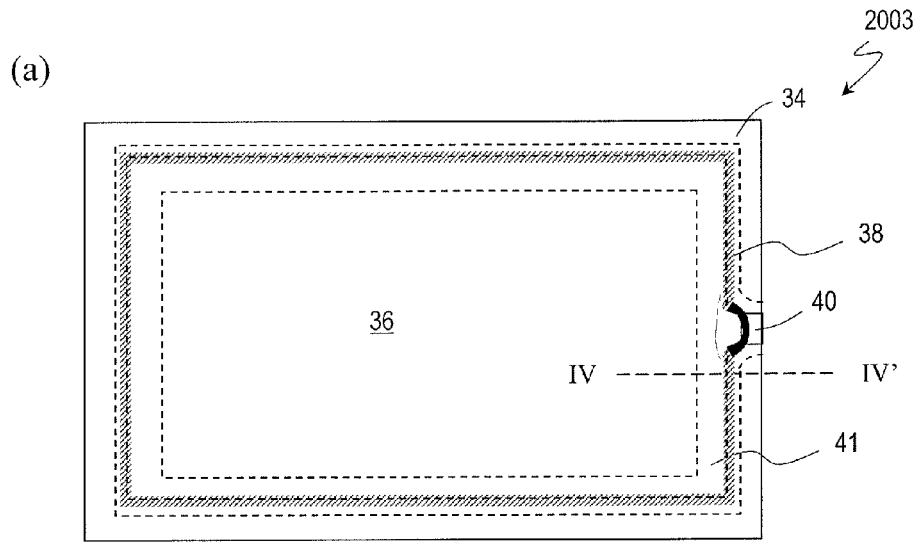
FIGS. 12 (a) and (b) are respectively a plan view and an enlarged cross-sectional view illustrating a liquid crystal display device 2003 as a fourth embodiment of the present invention.
Figure 12:
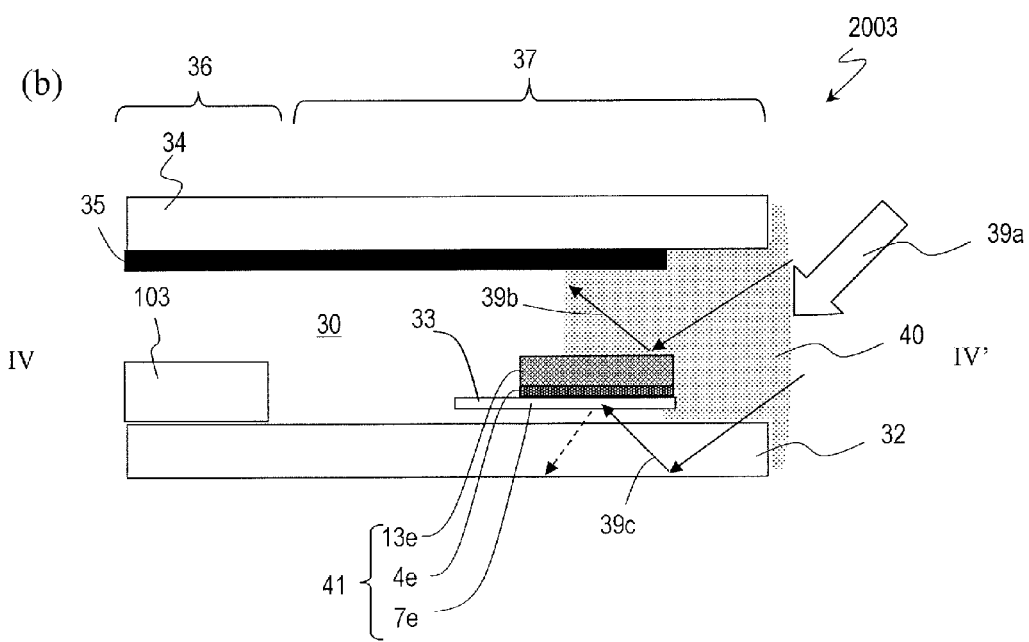

FIGS. 12(a) and 12(b) are respectively a plan view and an enlarged cross-sectional view illustrating a part of the peripheral portion of the liquid crystal display device of this embodiment. In FIG. 12, any component also shown in FIGS. 10 and 11 and having substantially the same function as its counterpart is identified by the same reference numeral and its description will be omitted herein for the sake of simplicity.

Also, when viewed along a normal to the substrate 32, this liquid crystal display device 2003 has a display area 36 including a plurality of pixels and a frame area 37 which surrounds the display area 36. A seal portion 38 which surrounds the liquid crystal layer 30 and a gap closing portion 40 to close the liquid crystal material injection port of the seal portion 38 have been formed in the frame area 37.

On the rear substrate 34 of this liquid crystal display device 2003, there is a multilayer film 41 in which an oxide semiconductor layer 7e, a low reflecting layer 4e and a metal layer 13e have been stacked in this order. When viewed along a normal to the substrate 32, the seal portion 38 and the gap closing portion 40 are arranged so as to partially overlap with the black matrix 35 and the multilayer film 41. The multilayer film 41 is suitably arranged so as to surround the display area 36. The metal layer 13e is arranged to face a portion of the black matrix 35 that overlaps with the gap closing portion 40 and functions as a light reflecting layer. A portion of the upper surface of the oxide semiconductor layer 7e is suitably not covered with the metal layer 13e. That portion of the upper surface of the oxide semiconductor layer 7e that is not covered with the metal layer 13e functions as a light absorbing layer.

In this embodiment, the oxide semiconductor layer 7e is also made of the same semiconductor film as the active layer of the oxide semiconductor TFT 103. Also, the metal layer 13e is made of the same metal film as the source and drain electrodes. And the low reflecting layer 4e is a reaction layer which has been formed between the metal layer 13e and the oxide semiconductor layer 7e through an annealing process, and is formed simultaneously with the low reflecting layer 4s, 4d of the oxide semiconductor TFT 103 (see FIG. 1).

In this liquid crystal display device 2003, a portion of the seal member and the gap closing member is directly irradiated and cured with light (such as a UV ray) 39a that has come from outside of the device and transmitted through the front substrate 34. Another portion of the seal member and the gap closing member gets cured with a light ray 39b that has come from outside of this device, transmitted through the front substrate 34 and then reflected from the surface of the metal layer 13e.

In this embodiment, parts 39b and 39c of the incoming light to cure the seal member and the gap closing member do enter this LCD panel but are absorbed into either the black matrix 35 or the oxide semiconductor layer 7e and not incident on the display area 36, either. Consequently, it is possible to prevent the incoming UV ray from being reflected a number of times inside this liquid crystal display device 2003 and eventually incident on the channel region of the oxide semiconductor TFT 103.

According to this embodiment, a part of the gap closing portion 40 can be arranged so as to overlap with the peripheral portion of the black matrix 35. In addition, since the stray light can be reduced, the interval between the oxide semiconductor TFT 103 and the gap closing portion 40 can be shortened. As a result, the frame area 37 can have a smaller area (i.e., can be narrowed).

Furthermore, the multilayer film 41 comprised of the oxide semiconductor layer 7e, the low reflecting layer 4e and the metal layer 13e may also be used as a static electricity protection line or a signal line. Then, the frame area can be further narrowed.

According to this embodiment, the oxide semiconductor layer 7e, the low reflecting layer 4e and the metal layer 13e can be formed in the same process step as the process step of forming the oxide semiconductor TFT 103. As a result, deterioration of the TFT performance due to incidence of light can be minimized without increasing the number of manufacturing process steps to perform.

As in the embodiment described above, if a portion 33 of the upper surface of the oxide semiconductor layer 7e is exposed under the metal layer 13e, that exposed portion 33 functions as a light absorbing layer, and the stray light can be reduced even more effectively. That portion functioning as a light absorbing layer is suitably located closer to the display area 36 than the seal portion 38 and the metal layer 13e are. Optionally, a single oxide semiconductor layer may be provided as a light absorbing layer closer to the display area 36 than the multilayer film 41 is, separately from the multilayer film 41.

It should be noted that even if only a light absorbing layer is provided for such a liquid crystal display device that uses a vacuum process without arranging any light reflecting layer, the deterioration of the TFT performance due to incidence of stray light can also be minimized. As the light absorbing layer, an oxide semiconductor layer may be used. In that case, when viewed along a normal to the substrate, the seal portion and the gap closing portion are suitably arranged outside of the oxide semiconductor layer that functions as a light absorbing layer and the black matrix.

INDUSTRIAL APPLICABILITY

The present invention is applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner. The present invention can be used particularly effectively in a liquid crystal display with a big monitor screen.

REFERENCE SIGNS LIST

1 substrate
3a gate electrode
3c gate connecting line
3g gate bus line
4s, 4d, 4e low reflecting layer
5 gate insulating layer
7 oxide semiconductor layer (active layer)
7s first contact region
7d second contact region
7c channel region
7e oxide semiconductor layer (light absorbing layer)
9 etch stop
13as source electrode
13ad drain electrode
13s source bus line
13e metal layer (light reflecting layer)
20 interlayer insulating layer
20A first interlayer insulating layer (passivation film)
20B second interlayer insulating layer
19 pixel electrode
19c conductive layer
29, 60a, 60b light (visible radiation)
30 liquid crystal layer
32 rear substrate
34 front substrate
36 display area
37 frame area
38 seal portion
39a, 39b, 39c light (ultraviolet ray, visible radiation)
40 gap closing portion
41 multilayer film
103, 203 oxide semiconductor TFT
107, 108, 109 source-gate connecting portion
1001, 1002, 3001, 3002 semiconductor device
2001, 2002, 2003 liquid crystal display device

The invention claimed is:

1. A semiconductor device comprising a substrate and a thin-film transistor on the substrate, wherein the thin-film transistor includes:
   an oxide semiconductor layer including a channel region, a source contact region, and a drain contact region that are located on right- and left-hand sides of the channel region;
   a gate electrode between the substrate and the oxide semiconductor layer to overlap with at least the channel region of the oxide semiconductor layer;
   a gate insulating layer between the gate electrode and the oxide semiconductor layer;
   a source electrode electrically connected to the source contact region; and
   a drain electrode electrically connected to the drain contact region, wherein
   the source electrode is electrically connected to a source bus line,
   the source electrode, the source bus line, and the drain electrode include a first metallic element and the oxide semiconductor layer includes a second metallic element,
   when viewed along a normal to the substrate, at least respective portions of the source electrode, the source bus line, and the drain electrode overlap with the oxide semiconductor layer,
   a low reflecting layer including the first metallic element and the second metallic element having a lower reflectance to visible radiation than the source electrode is between the source electrode and the oxide semiconductor layer, between the source bus line and the oxide semiconductor layer, and between the drain electrode and the oxide semiconductor layer, and
   all lower surfaces of each of the source electrode, the source bus line, and the drain electrode are entirely in contact with the low reflecting layer.

2. The semiconductor device of claim 1, wherein the second metallic element is indium and the low reflecting layer includes indium metal.

3. The semiconductor device of claim 1, wherein the low reflecting layer is a reaction layer which has been formed through oxidation of the first metallic element and reduction of the second metallic element which have been caused by a reaction between the source electrode, the source bus line, and the drain electrode and the oxide semiconductor layer.

4. The semiconductor device of claim 1, wherein when viewed along a normal to the substrate, the low reflecting layer is extended from one end of the source electrode that faces the channel region toward the drain electrode by a distance Ds to partially cover the channel region and also extended from one end of the drain electrode that faces the channel region toward the source electrode by a distance Dd to partially cover the channel region, and wherein the sum of these distances Ds and Dd is smaller than a channel length.

5. The semiconductor device of claim 4, wherein the distances Ds and Dd are both 0.1 μm to 1.0 μm.

6. The semiconductor device of claim 1, further comprising an etch stop which covers at least the channel region of the oxide semiconductor layer.

7. The semiconductor device of claim 1, further comprising a first interlayer insulating layer which covers the source electrode, the source bus line and the drain electrode, and
   wherein the low reflecting layer is obtained by forming the source electrode, the source bus line, and the drain electrode on the oxide semiconductor layer, forming the first interlayer insulating layer which covers the source electrode, the source bus line, and the drain electrode and then performing an annealing process at a temperature of 200° C. to 400° C.

8. The semiconductor device of claim 1, further comprising a backlight which is arranged at the rear of the substrate.

9. The semiconductor device of claim 1, wherein the first metallic element is titanium, the oxide semiconductor layer includes an In—Ga—Zn—O based semiconductor, and the second metallic element is indium.

10. A liquid crystal display device including the semiconductor device of claim 1, the display device comprising:
a counter substrate which is arranged to face the substrate;
a liquid crystal layer which is interposed between the substrate and the counter substrate; and
a seal portion which is made of a seal member including a photocurable resin and which surrounds the liquid crystal layer, and wherein
the liquid crystal display device has a display area with a plurality of pixels and a frame area which is located around the periphery of the display area, the thin-film transistor is arranged in the display area, and the seal portion is arranged in the frame area, and
wherein in the frame area, a light absorbing layer which absorbs light to cure the seal member has been formed between the seal portion and the display area on the substrate, and
an opaque layer has been formed between the seal portion and the display area on the counter substrate, and
the light absorbing layer is an oxide semiconductor layer which has been formed of the same oxide semiconductor film as the oxide semiconductor layer of the thin-film transistor.

11. A liquid crystal display device including the semiconductor device of claim 1, the display device comprising:
a counter substrate which is arranged to face the substrate;
a liquid crystal layer which is interposed between the substrate and the counter substrate; and
a seal portion which is made of a seal member including a photocurable resin and which surrounds the liquid crystal layer, and
wherein the liquid crystal display device has a display area with a plurality of pixels and a frame area which is located around the periphery of the display area, the thin-film transistor is arranged in the display area, and the seal portion is arranged in the frame area, and
wherein in the frame area, a light reflecting layer which reflects light to cure the seal member has been formed on the substrate so as to partially overlap with the seal portion, and
an opaque layer has been formed on the counter substrate so as to partially overlap with the seal portion and to face the light reflecting layer, and
the light reflecting layer is a metal layer which has been formed of the same metal film as the source electrode, and between the metal layer and the substrate, stacked in this order on the substrate are a light absorbing layer which is formed of the same oxide semiconductor film as the oxide semiconductor layer of the thin-film transistor and a layer which includes the first and second metallic elements and which has a lower reflectance to the light than the metal layer.

12. The liquid crystal display device of claim 11, wherein a portion of the light absorbing layer is located between the seal portion and the display area and is not covered with the metal layer.

13. The liquid crystal display device of claim 10, wherein the seal portion has a gap through which a liquid crystal material is injected, and wherein
the display device further includes a gap closing portion which is made of a photocurable resin and which is used to close the gap, and
wherein the light absorbing layer is also arranged between the gap closing portion and the display area.

14. The liquid crystal display device of claim 11, wherein the seal portion has a gap through which a liquid crystal material is injected, and
wherein the display device further includes a gap closing portion which is used to close the gap, and
wherein the light reflecting layer is arranged to overlap with the gap closing portion, too.

15. A liquid crystal display device comprising:
a substrate including a thin-film transistor on the substrate;
a counter substrate facing the substrate;
a liquid crystal layer between the substrate and the counter substrate; and
a seal portion including a photocurable resin which surrounds the liquid crystal layer, wherein
the thin-film transistor includes:
an oxide semiconductor layer including a channel region, and a source contact region and a drain contact region on a right side and a left side of the channel region;
a gate electrode between the substrate and the oxide semiconductor layer to overlap with at least the channel region;
a gate insulating layer between the gate electrode and the oxide semiconductor layer;
a source electrode electrically connected to the source contact region; and
a drain electrode electrically connected to the drain contact region, wherein
the source electrode is electrically connected to a source bus line,
the source electrode, the source bus line, and the drain electrode include a first metallic element and the oxide semiconductor layer includes a second metallic element,
when viewed along a normal to the substrate, at least respective portions of the source electrode, the source bus line, and the drain electrode overlap with the oxide semiconductor layer,
a low reflecting layer including the first metallic element and the second metallic element having a lower reflectance to visible radiation than the source electrode is between the source electrode and the oxide semiconductor layer, between the source bus line and the oxide semiconductor layer, and between the drain electrode and the oxide semiconductor layer,
the liquid crystal display device has a display area including a plurality of pixels and a frame area around a periphery of the display area, the thin-film transistor is in the display area, and the seal portion is in the frame area,
in the frame area, a light absorbing layer which absorbs light to cure the seal portion is between the seal portion and the display area on the substrate,
an opaque layer is between the seal portion and the display area on the counter substrate, and the light absorbing layer is made of a same oxide semiconductor film as the oxide semiconductor layer.

\* \* \* \* \*